United States Patent
Kilian

(10) Patent No.: US 9,341,675 B2
(45) Date of Patent: May 17, 2016

(54) TEST CARD FOR TESTING ONE OR MORE DEVICES UNDER TEST AND TESTER

(71) Applicant: Advantest (Singapore) Pte. Ltd., Singapore (SG)

(72) Inventor: Jens Kilian, Herrenberg (DE)

(73) Assignee: ADVANTEST CORPORATION, Tokyo (JP)

( * ) Notice: Subject to any disclaimer, the term of this patent is extended or adjusted under 35 U.S.C. 154(b) by 161 days.

(21) Appl. No.: 13/952,491

(22) Filed: Jul. 26, 2013

(65) Prior Publication Data

US 2013/0311844 A1    Nov. 21, 2013

Related U.S. Application Data

(63) Continuation of application No. PCT/EP2011/051154, filed on Jan. 27, 2011.

(51) Int. Cl.
*G01R 31/28* (2006.01)
*G06F 11/00* (2006.01)
*G01R 31/3181* (2006.01)
*G01R 31/319* (2006.01)

(52) U.S. Cl.
CPC .... *G01R 31/31813* (2013.01); *G01R 31/31907* (2013.01)

(58) Field of Classification Search
CPC .................... G01R 31/31813; G01R 31/31907
USPC ........................................ 714/724, 727, 738
See application file for complete search history.

(56) References Cited

U.S. PATENT DOCUMENTS

| | | | |
|---|---|---|---|
| 2003/0009715 A1* | 1/2003 | Ricchetti et al. | 714/727 |
| 2003/0115396 A1 | 6/2003 | Leinen | |
| 2009/0300327 A1* | 12/2009 | Omtzigt | 712/42 |

FOREIGN PATENT DOCUMENTS

EP    2375335    12/2011

\* cited by examiner

*Primary Examiner* — Guy Lamarre

(57) ABSTRACT

A test card for testing one or more devices under test includes a plurality of test resources configured to communicate with the one or more devices under test. The test card further includes a matching circuit configured to receive a test sequence of at least two matching instructions followed by one or more processing instructions. The matching instructions define a group of resources which are to operate in accordance with the processing instructions. The matching circuit is configured to determine based on the at least two matching instructions whether a given test resource out of a plurality of test resources belongs to the group or not and to forward the processing instructions to the given test resource if the given test resource belongs to the group and to not forward the processing instructions to the given test resource if the given test resource does not belong to the group.

12 Claims, 13 Drawing Sheets

| | |
|---|---|
| A | TestSequence (107) arrives in buffer (201) |
| B | Set 2$^{nd}$ memory (215) to false ad 3$^{rd}$ memory (217) to true |
| C | While instructions remain in buffer (201): |
| D | Transfer one instruction from buffer to instruction register (203) |
| E | Decode instruction in register (203) |
| F | Compute value of 1$^{st}$ memory (213) |
| G | Compute value of 2$^{nd}$ memory (215) |
| H | Compute value of 3$^{rd}$ memory (217) |
| I | Final value of 3$^{rd}$ memory (217) becomes selection signal for resources |
| J | Pass remainder of test sequence (processing instructions 108) to selected resources |

FIGURE 3

| instruction | 2nd memory (215) | 3rd memory (217) | negated? | type |
|---|---|---|---|---|
| MATCH_PHYSICAL_LOCATION<br>MATCH_LAST_PHYSICAL_LOCATION<br>MATCH_NOT_PHYSICAL_LOCATION | updated<br>updated | updated<br>updated | yes | physical address instructions |
| MATCH_LOGICAL_ADDRESS<br>MATCH_LAST_LOGICAL_ADDRESS<br>MATCH_NOT_LOGICAL_ADDRESS | updated<br>updated | updated<br>updated | yes | logical address instructions |
| MATCH_BITMAP<br>MATCH_LAST_BITMAP<br>MATCH_NOT_BITMAP | updated<br>updated | updated<br>updated | yes | subgroup membership instructions |
| MATCH_HARDWARE_VARIANT<br>MATCH_LAST_HARDWARE_VARIANT<br>MATCH_NOT_HARDWARE_VARIANT | updated<br>updated | updated<br>updated | yes | hardware revision instructions |
| MATCH_CONDITION<br>MATCH_LAST_CONDITION<br>MATCH_NOT_CONDITION | updated<br>updated | updated<br>updated | yes | condition instructions |

FIGURE 4

TEST CARD FOR TESTING ONE OR MORE DEVICES UNDER TEST AND TESTER

CROSS-REFERENCE TO RELATED APPLICATIONS

This application is a continuation of copending International Application No. PCT/EP2011/051154, filed Jan. 27, 2011, which is incorporated herein by reference in its entirety.

BACKGROUND OF THE INVENTION

In a conventional test system, multiple (up to several thousands) measurement instruments are connected to a controlling computer. The measurement instruments can be of different types (e.g., for measuring digital signal levels, analog voltages or currents, low or high frequencies, or even non-electrical properties like temperatures). Typically more than one instrument of each type is available so that multiple devices under test can be tested at once. The controller often accesses groups (subsets) of these instruments (for example, only those digital measurement instruments that are connected to a specific port or terminal of a device under test).

Such a conventional test system provides a mechanism for setting up groups of instruments, typically a limited number (for example 32). One disadvantage of such a mechanism is that the number of available groups is small compared to the number of subsets that are typically accessed by a test program. For example, some devices may use 100 or 200 subsets, with only 32 groups available. Another disadvantage is that setting up or changing the instruments contained in a group is a slow operation, typically requiring several microseconds per instrument which is added to or removed from the group.

In the following, a concept of such a conventional test system and the disadvantages thereof will be described in short. To simplify the exposition, the test system is assumed to contain a number of identical test resources, each of which is connected to one signal pin of one of a number of devices under test.

A mechanism for grouping channels ("common access") in such a conventional test system uses two 32-bit registers and some internal logic. The mechanism for grouping channels in the conventional test system is shown in a block schematic diagram in FIG. 10.

A first register (a channel code register 11) holds the bit-map of groups to which the channel belongs. Each bit in this register corresponds to one available group. Each test resource of the conventional test system typically comprises its own channel code register 11. The channel code register 11 is typically reprogrammable during a test. As mentioned before this reprogramming is very time-consuming. The number of reprogramming cycles therefore should be minimized during the test.

A second register (a channel mask register 13) selects which groups are currently active. The channel mask register 13 is typically a global register whose content is distributed to the individual test resources for comparing it with the channel code register 11. The currently active groups change typically very often during a test and therefore the channel mask register 13 also changes very often. Based on the comparison of the current content of the channel mask register 13 with the current content of the channel code register 11, at each test resource a common access "select" signal can be determined, whose state indicates whether or not the test resource belongs to at least one group defined by the channel mask register 13. The common access "select" signal may for example be determined by using 32 2-input AND gates, 15-1 to 15-32 (one AND gate per bit of the channel code register 11 and of the channel mask register 13) and one 32-input OR gate 17 per test resource. By using this concept every bit of the channel mask register 13 is compared with its corresponding bit in the channel code register 11 and if at least one of the comparisons provides a true information, the OR gate 17 also provides a true information as the common access "select" signal, i.e. the test resource is part of at least one group defined in the channel mask register 13.

It is also possible that several groups can be active at once, if more than one bit in the channel mask register 13 is set.

The main disadvantage of a conventional test system which uses the concept shown in FIG. 10 is the limited, small number of groups that can be supported (32 in the example of FIG. 10). This involves frequent reprogramming of the channel code register 11 when more than this small number of groups are needed (for example, in multisite testing), leading to decreased test throughput.

SUMMARY

Embodiments according to the present invention relate to a test card for testing one or more devices under test. Further embodiments of the present invention relate to a tester for testing one or more devices under test. Further embodiments of the present invention relate to a test system for testing one or more devices under test. Further embodiments of the present invention relate to methods for communicating with one or more devices under test.

According to an embodiment, a test card for testing one or more devices under test may have: a plurality of test resources, configured to communicate with the one or more devices under test; and a matching circuit configured to receive a test sequence of at least two matching instructions followed by one or more processing instructions; wherein the at least two matching instructions define a group of test resources which are to operate in accordance with the processing instructions; and wherein the matching circuit is configured to determine based on the at least two matching instructions whether a given test resource out of the plurality of test resources belongs to the group of test resources which are to operate in accordance with the processing instructions or not and to forward the processing instructions to the given test resource if the given test resource belongs to the group of test resources which are to operate in accordance with the processing instructions and to not forward the processing instructions to the given test resource if the given test resource does not belong to the group of test resources which are to operate in accordance with the processing instructions.

According to another embodiment, a method for communicating with one or more devices under test, using a plurality of test resources may have the steps of: receiving a sequence of at least two matching instructions followed by one or more processing instructions, wherein the at least two matching instructions define a group of test resources which are to operate in accordance with the processing instructions; determining based on the at least two matching instructions whether a given test resource out of the plurality of test resources belongs to the group of test resources which are to operate in accordance with the processing instructions or not and forwarding the processing instructions to the given test resource if the given test resource belongs to the group of test resources which are to operate in accordance with the processing instructions and not forwarding the processing instructions to the test resource if the test resource does not belong to the group of test resources which are to operate in accordance with the processing instructions.

According to another embodiment, a tester for testing one or more devices under test may have: a test card for testing one or more devices under test, which test card may have: a plurality of test resources, configured to communicate with the one or more devices under test; and a matching circuit configured to receive a test sequence of at least two matching instructions followed by one or more processing instructions; wherein the at least two matching instructions define a group of test resources which are to operate in accordance with the processing instructions; and wherein the matching circuit is configured to determine based on the at least two matching instructions whether a given test resource out of the plurality of test resources belongs to the group of test resources which are to operate in accordance with the processing instructions or not and to forward the processing instructions to the given test resource if the given test resource belongs to the group of test resources which are to operate in accordance with the processing instructions and to not forward the processing instructions to the given test resource if the given test resource does not belong to the group of test resources which are to operate in accordance with the processing instructions; and a processing unit configured to communicate with the test card, wherein the processing unit is configured to provide the test sequence of the at least two matching instructions followed by the processing instructions to the test card.

According to another embodiment, a method for communicating with one or more devices under test using a plurality of test resources may have the steps of: sending a test sequence of at least two matching instructions followed by one or more processing instructions to the plurality of test resources, wherein the matching instructions define a group of test resources which are to operate in accordance with the processing instructions; for each test resource of the plurality of test resources receiving the sequence of at least two matching instructions followed by the processing instructions; determining based on the at least two matching instructions whether a test resource belongs to the group of test resources which are to operate in accordance with the processing instructions or not; and forwarding the processing instructions to the given test resource if the test resource belongs to the group of test resources which are to operate in accordance with the processing instructions and not forwarding the processing instructions to the test resource if the test resource does not belong to the group of test resources which are to operate in accordance with the processing instructions.

An embodiment provides a test card for testing one or more devices under test. The test card comprises a plurality of test resources configured to communicate with the one or more devices under test (device under test-DUT). A test resource is an individually addressable unit which can stimulate the device under test and/or perform measurements of the state of the device under test.

The test card further comprises a matching circuit configured to receive a test sequence comprising a sequence of at least two matching instructions followed by a sequence of processing instructions (comprising, at least one processing instruction). The matching instructions define a group of test resources which are to operate in accordance with the processing instructions. The matching circuit is configured to determine based on the at least two matching instructions whether a given test resource of the plurality of test resources belongs to the group or not. The matching circuit is further configured to forward the processing instructions to the given test resource if the given test resource belongs to the group and to not forward the processing instructions to the given test resource if the given test resource does not belong to the group.

Embodiments are based on the central idea that a more flexible addressing scheme for test resources can be achieved using a test sequence comprising at least two matching instructions based on which a matching circuit determines if a test resource belongs to a group of test resources which are to operate in accordance with processing instructions in the test sequence. In this way, the matching circuit can determine based on the combination of the at least two matching instructions, whether or not it has to forward the processing instructions to a given test resource. As described before, in a conventional concept a test sequence typically comprises the content of the channel mask register 13, which is compared in a test resource with the channel code register 11. The new concept which is used in embodiments has an advantage over the conventional concept in that it provides a more flexible addressing scheme by using a test sequence which can comprise more than one matching instructions which are processed by a matching circuit to determine if a test resource belongs to a group of test resources which are to operate in accordance with processing instructions of the test sequence. By processing more than one matching instructions rather than just comparing the content of the channel mask register 13 with the content of the channel code register 11, as it is done in the conventional concept, the new concept avoids the frequent reprogramming of registers in the test resources which is the main disadvantage of the conventional concept.

According to embodiments, different test resources of the plurality of test resources of the test card may be associated to different terminals of a device under test. A test resource associated to a terminal of a device under test may, for example, be configured to sense a voltage or a current at the terminal of the device under test or to apply a voltage or a current at the terminal of the device under test in accordance with the processing instructions.

In other words, test resources may be configured to communicate with the devices under test using terminals (for example, pins or contacts) of the devices under test in response to processing instructions, which have been forwarded from a matching circuit associated to the test resource.

Furthermore, the test card may be configured to test a plurality of devices under test. Therefore, different test resources of the plurality of test resources may be associated to different devices under test. Different devices under test may be of the same type. A test may therefore run in parallel on all devices under test of the same type. Therefore, a plurality of test resources, which are associated to equal terminals of different devices under test of the same type may belong to a group of test resources, which are to operate in accordance with the same processing instructions. Therefore, a test sequence may, for example, comprise matching instructions defining a group of test resources which are associated to equal terminals of different devices under test of the same type which all have to perform the same processing instructions. As mentioned before, a test resource may be a channel of a test system, wherein in an application, a channel of a test system is typically connected to one terminal of a device under test.

According to embodiments, the matching circuit may be configured to subsequently process the matching instructions and to combine results of the matching instructions to obtain a combined matching result for a given test resource and to forward the processing instructions to the given test resource based on the truth value of the combined matching result. The matching circuit may, for example, forward the processing instructions to the test resource if at least one of the matching instructions or if all matching instructions provide a true information as a result.

Different matching instructions may be from different types of matching instructions. The different types of matching instructions may differ in a memory to which the matching circuit has to apply the matching instructions. In other words, several different matching instructions can be provided, such as: look up the status of the test resource in a local memory (for example, similar to the channel code register 11) that specifies whether the test resource is part of a defined group (subgroup membership instructions); match the physical location of the test resource, for example, card cage and slot in a test system (physical address instructions); match a logical identifier of the test resource, for example, a logical ID assigned by software (logical address instructions); match a particular version or revision of the test resource, for example, one particular type of measurement instrument (hardware version instructions); match a condition that holds true on the test resource, for example, that it has detected a defective device under test (condition instructions); or a subgroup thereof. By providing these different types of matching instructions, embodiments can address test resources by physical location in the test system, by logical name or identifier, by the versions of the test resources, by the status of the test resources, or by an arbitrary combination of such addresses. Using appropriate combinations of matching instructions of different types, and combining the results of individual matching instructions, allows groups of test resources to be formed without "a priori" definition of such groups (as may be used by the concept of FIG. 10). In particular, the sizes of the circuits and memories that may be used are not determined by the total number of possible groups.

According to an embodiment, the test sequence may also comprise a restart instruction, for example, directing the matching circuit to skip ahead in the test sequence and restart the matching process if a mismatch is detected. This allows a single test sequence to contain multiple independent instruction sequences (each comprising at least two matching instructions and at least one processing instruction), for example, to provide alternate versions of a command to different versions of a test resource. For example, two different test resources, which are associated to equal terminals of different devices under test from the same type, may perform the same operation. But because of different hardware versions of the test resources they may need different instructions to perform this operation. In an embodiment a test sequence may comprise a first sequence of matching instructions, which define a first test resource of the two test resources with different hardware variants and provide the processing instructions which are adapted to the first test resource. After the processing instructions adapted for the first test resource, the test sequence may comprise a restart instruction, followed by a second sequence of matching instructions and processing instructions, the second sequence of matching instructions defining a second test resource from the two test resources with different hardware variants. The processing instructions following the second sequence of matching instructions are adapted for the second test resource. Therefore, each test resource only receives the processing instructions which are adapted to its hardware variant.

According to an embodiment the test card may comprise a plurality of matching circuits, wherein each matching circuit out of a plurality of matching circuits is associated to one test resource out of the plurality of test resources. In other words, the test card may comprise one matching circuit per test resource. The test sequence may be broadcast to each matching circuit of the test card. If a matching circuit determines that the test resource associated to it does not belong to the group of test resources which are to operate in accordance with the processing instructions the matching circuit may discard the processing instructions.

According to a further embodiment, a matching circuit may be configured to be associated to a subplurality of test resources out of the plurality of test resources. A matching circuit may therefore determine for each test resource which is associated to the matching circuit if the test resource belongs to the group of test resources which are to operate in accordance with the processing instructions. The matching circuit may compute a match (determine if a test resource belongs to the group of test resources which are to operate in accordance with the processing instructions) for each test resource sequentially or in parallel and may only forward the processing instructions to the test resources which belong to the group of test resources which are to operate in accordance with the processing instructions.

BRIEF DESCRIPTION OF THE DRAWINGS

Embodiments of the present invention will be detailed subsequently referring to the appended drawings, in which:

FIG. 3 shows a flow diagram describing the functionality of a matching circuit which may be employed in the test card from FIG. 2*a*;

FIG. 4 shows a table of different matching instructions;

Figure 1A:
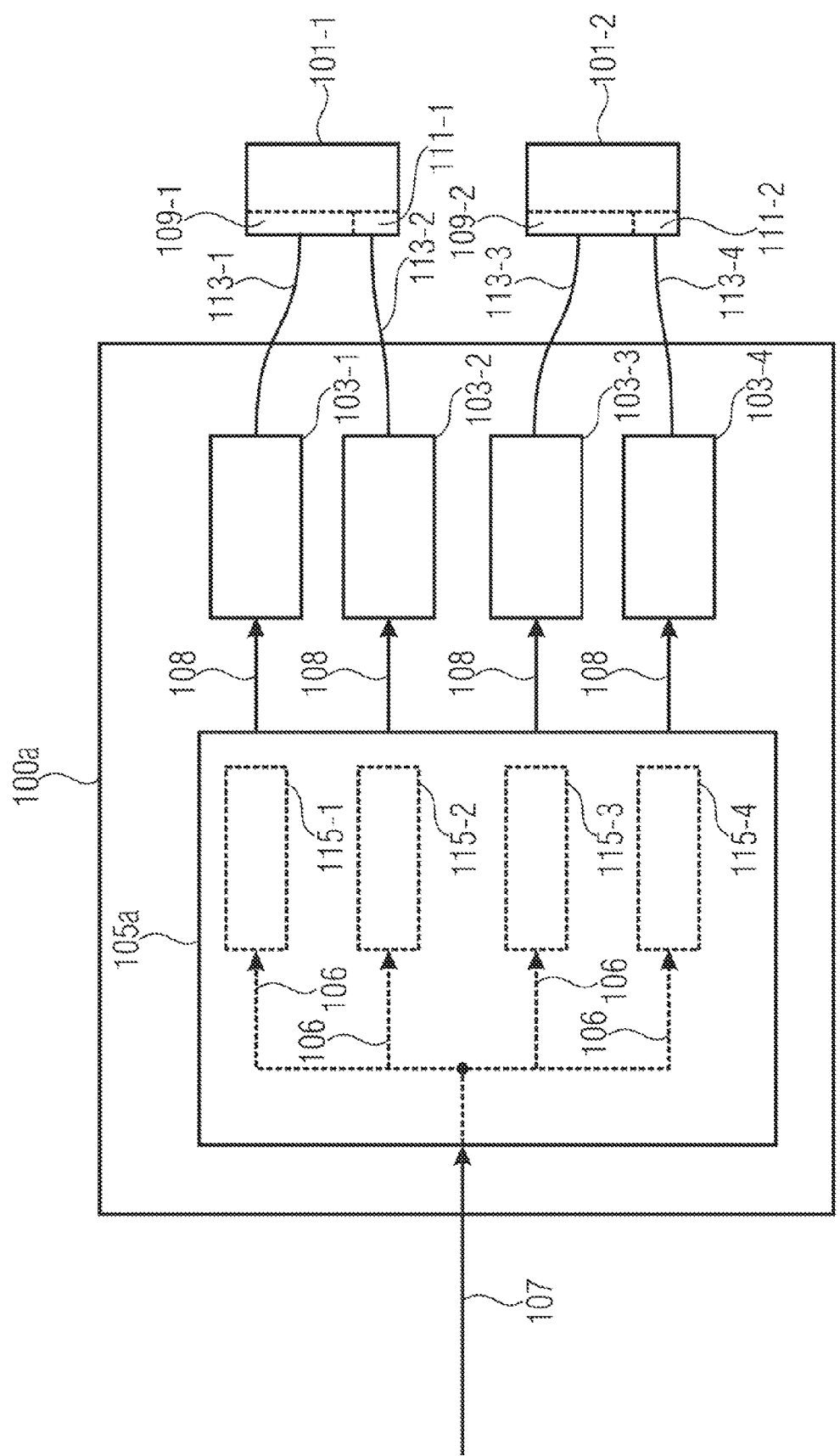
FIG. 1*a* shows a block diagram of a test card for testing one or more devices under test according to an embodiment.

It is to be pointed, out that in the following the same or functionally equal elements are provided with the same reference numerals and that a repeated description of these elements shall be omitted. Descriptions of elements provided with the same reference numerals therefore are mutually interchangeable.

DETAILED DESCRIPTION OF THE INVENTION

FIG. 1*a* shows a block diagram showing a test card 100*a* for testing one or more devices under test which is connected to a first device under test 101-1 and a second device under test 101-2.

The test card 100a comprises a plurality of test resources 103-1 to 103-4 configured to communicate with the devices under test, 101-1 to 101-2.

The test card 100a further comprises a matching circuit 105a configured to receive a test sequence 107 of at least two matching instructions 106 followed by one or more processing instruction(s) 108. The matching instructions 106 define a group of test resources which are to operate in accordance with the processing instructions 108. The matching circuit 105a is configured to determine based on the at least two matching instructions 106 whether a given test resource out of the plurality of test resources 103-1 to 103-4 belongs to the group or not and if the given test resource belongs to the group, to forward the processing instructions 108 to the given test resource, respectively, if the given test resource does not belong to the group, to not forward the processing instructions 108 to the given test resource.

Each test resource 103-1 to 103-4 can be associated with a terminal (for example a contact or a pin) of one of the devices under test 101-1 to 101-2. For example, a first test resource 103-1 may be associated to a first terminal 109-1 of the first device under test 101-1, a second test resource 103-2 may be associated to a second terminal 111-1 of the first device under test 101-1, a third test resource 103-3 may be associated to a first terminal 109-2 of the second device under test 101-2 and a fourth test resource 103-4 may be associated to a second terminal 111-2 of the second device under test 101-2.

Each test resource 103-1 to 103-4 therefore may be associated with one device under test out of devices under test 101-1 to 101-2.

Each test resource 103-1 to 103-4 may be configured to get connected to its associated terminal 109-1 to 111-2 of its associated device under test 101-1 to 101-2, for example, using conducting paths 113-1 to 113-4 (such as wires or cables).

A test resource 103-1 to 103-4 may be configured to apply a stimulus and/or to perform a measurement at a terminal 109-1 to 111-2 associated with it based on the processing instructions 108, forwarded by the matching circuit 105a. In other words, the test sequence 107 comprises the at least two matching instructions 106 which are to be processed by the matching circuit 105a and the processing instructions 108, which are to be processed by the test resources 103-1 to 103-4.

As can be seen from FIG. 1a, the matching circuit 105a is associated to more than one test resource. In the concrete example shown in FIG. 1a the matching circuit 105a is associated to the four test resources 103-1 to 103-4. This means, the matching circuit 105a is configured to process the at least two matching instructions 106 for each of the test resources 103-1 to 103-4 to determine which of the test resources 103-1 to 103-4 is/are defined by the at least two matching instructions 106 as being part of the group which is to operate in accordance with the processing instructions 108. The matching circuit 105a may process the at least two matching instructions 106 sequentially for each test resource 103-1 to 103-4. The matching circuit 105a may therefore also forward the processing instructions 108 sequentially to the test resources 103-1 to 103-4.

According to a further embodiment, the matching circuit 105a may also process the at least two matching instructions 106 sequentially for the test resources 103-1 to 103-4, but may forward the processing instructions 108 to the test resources 103-1 to 103-4 in parallel (at the same time) such that the test resources 103-1 to 103-4 which are to operate in accordance with the processing instructions 108 process the processing instructions 108 simultaneously. The matching circuit 105a may therefore first process the at least two matching instructions 106 for all test resources 103-1 to 103-4 and may afterwards forward the processing instructions 108 simultaneously only to those test resources, which are to operate in accordance with the processing information 108.

According to another embodiment, the matching circuit 105a may also process the at least two matching instructions 106 for each test resource 103-1 to 103-4 in parallel and may forward the processing instructions 108 to the test resources 103-1 to 103-4, which are to operate in accordance with the processing instructions 108, in parallel.

According to an embodiment the matching circuit 105a may apply the at least two matching instructions 106 to one or more memories associated to each test resource 103-1 to 103-4. In other words, the matching, circuit 105a may comprise a memory hank 115-1 to 115-4 for each test resource 103-1 to 103-4 to which the matching circuit 105a applies the at least two matching instructions 106.

Each memory bank 115-1 to 115-4 may comprise one or more different memories or registers associated with each test resource 103-1 to 103-4. The at least two matching instructions 106 in the test sequence 107 may be from different types of matching instructions, wherein the different types of matching instructions differ in the memory or register (of a memory bank 115-1 to 115-4 associated to a test resource 103-1 to 103-4) they are applied to. The matching circuit 105a may be configured to subsequently process the at least two matching instructions 106 by applying each matching instruction to the memory or register associated with its type. Furthermore, the matching circuit 105a may be configured to forward the processing instructions 108 to a test resource 103-1 to 103-4 based on true information of at least one matching instruction of each type of matching instructions in the test sequence 107 for the test resource 103-1 to 103-4. Each memory bank 115-1 to 115-4 associated with one of the test resources 103-1 to 103-4 may comprise the same memories or registers, but with different content. At least a part of the memories or registers comprised in a memory hank 115-1 to 115-4 may be reprogrammable.

The memory banks 115-1 to 115-4 may, for example, comprise a subgroup membership memory which may be similar to the channel code register 11 described in conjunction with the conventional test system concept. This subgroup membership memory may be reprogrammable during a test and may define a subgroup to which the associated test resource 103-1 to 103-4 belongs. For example, at least a first matching instruction of the at least two matching instructions 106 in the test sequence 107 may be a subgroup membership instruction, defining a subgroup of test resources which are candidates for operating in accordance with the processing instructions 108. The matching circuit 105a may be configured to apply the subgroup membership instruction to the subgroup membership memories of each memory bank 115-1 to 115-4 to determine which of the test resources 103-1 to 103-4 is/are defined within the subgroup membership instruction. The matching circuit 105a may be configured to forward the processing instructions 108 to a test resource out of the plurality of test resources 103-1 to 103-4 based on a true information of the subgroup membership instruction for this test resource.

In this case, "based on" means, that if the test sequence 107 does not contain matching instructions from another type of matching instructions, the matching circuit 105a may forward the processing instructions 108 to a test resource of a plurality of test resources 103-1 to 103-4 if at least one subgroup membership instruction in the test sequence 107 provides a true information for the test resource (which means that the test resource is defined in the subgroup of test resources which are candidates for operating in accordance with the processing instructions 108).

Furthermore, "based on" means, that a true information of the subgroup membership instruction can be a prerequisite for forwarding the processing instructions 108 to the test resource, for example, when the test sequence 107 comprises more matching instructions from a different type than subgroup membership instructions. In this case, the matching circuit 105a may only forward the processing instructions 108 to the test resource if at least one matching instruction of each type of matching instructions inside the test sequence 107 provides a true information as a result.

Figure 10:
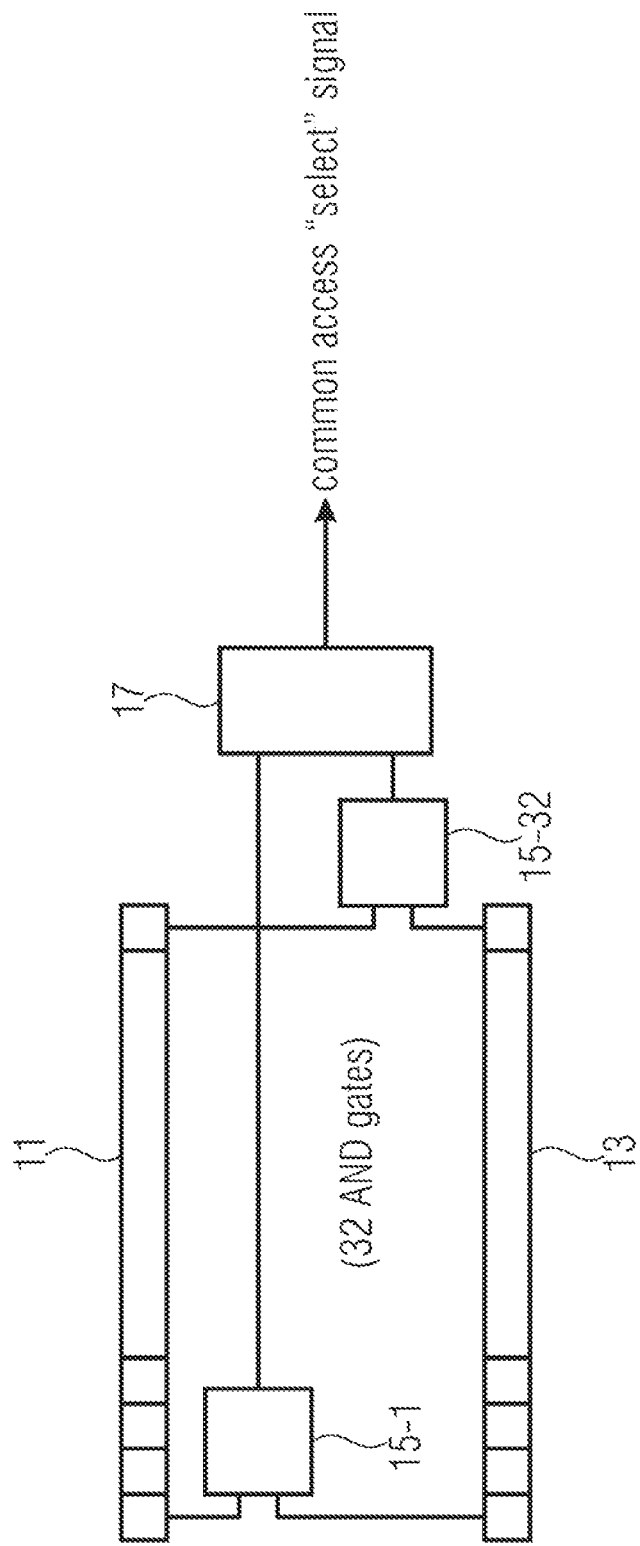
FIG. 10 shows a schematic illustration of a conventional addressing scheme used in a conventional test system.

The subgroup membership memory for each test resource 103-1 to 103-4 may be programmable, even during a test. The subgroup membership memory may therefore be similar to the conventional channel code register 11. The subgroup membership instructions may, for example, each comprise an address which is compared by the matching circuit 105a with an address of the subgroup membership memory for each test resource 103-1 to 103-4. An address in the subgroup membership instructions may, for example, be similar to the conventional channel mask register 13. Compared to the conventional concept in the concept shown in FIG. 10, different subgroup membership instructions inside the test sequence 107 may comprise different addresses (different channel masks) wherein in the conventional concept typically only one channel mask was used to determine if a test resource is selected for processing instructions. In the traditional concept a test resource was chosen to perform instructions if at least one bit in the channel mask register 13 and the corresponding bit in the channel code register 11 were set. In contrast to this, the matching circuit 105a may compare the complete address defined in a subgroup membership instruction with the address in the subgroup membership memories of the test resources 103-1 to 103-4 and only provide a true information or true result of the subgroup membership instruction if the two addresses are completely identical. Furthermore, the matching circuit 105a may, depending on the subgroup membership instruction, also provide a true result or true information for the subgroup membership instruction if only a part of the address (for example, one or more bits) in the subgroup membership instruction matches a corresponding part in the subgroup membership memories of the test resource 103-1 to 103-4. By having more than one subgroup membership instruction in the test sequence 107, a greater number of groups can be defined than it is possible using the conventional addressing scheme, as it is shown in FIG. 10.

The matching circuit 105a may, for example, be part of a central processing unit of the test card 100a. The matching circuit 105a may, for example, be connected using cables, wires or conducting paths with the test resources 103-1 to 103-4. In other words, the test resources 103-1 to 103-4 may be located spaced apart from each other (decentralized) and the matching, circuit 105a may be located spaced apart from the test resources 103-1 to 103-4 (the matching circuit 105a may reside in a central location).

Figure 1B:
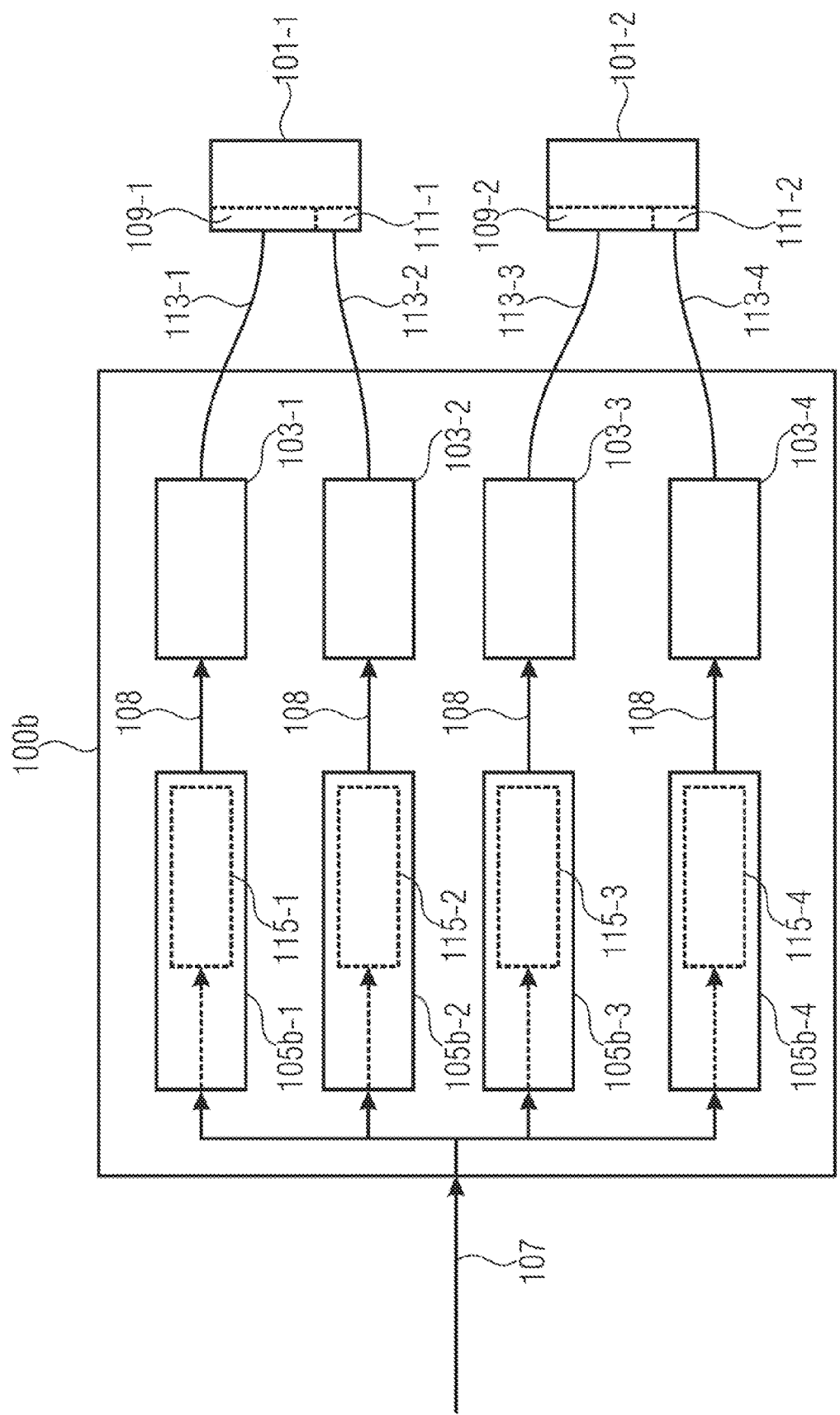
FIG. 1*b* shows a block diagram of a test card for testing one or more devices under test according to another embodiment.

FIG. 1b shows a block diagram of a test card 100b according to another embodiment.

The test card 100b differs from the test card 100a in that it comprises a plurality of matching circuits 105b-1 to 105b-4. Each matching circuit out of the plurality of matching circuits 105b-1 to 105b-4 is associated to (exactly) one test resource out of the plurality of test resources 103-1 to 103-4 of the test card 100b. Functionalities of the matching circuits 105b-1 to 105b-4 may be similar to the functionality of the matching circuit 105a with the difference that each matching circuit 105b-1 to 105b-4 is associated to one test resource out of the plurality of the test resources 103-1 to 103-4. Each matching circuit 105b-1 to 105b-4 may comprise a memory bank 115-1 to 115-4 which is associated to a test resource 103-1 to 103-4 which is connected and associated to the matching circuit 105b-1 to 105b-4. The matching circuits 105b-1 to 105b-4 may therefore process the matching instructions in the test sequence 107 in parallel, wherein each matching circuit 105b-1 to 105b-4 only processes the matching instructions for its associated test resource.

In the example shown in FIG. 1b, a first matching circuit 105b-1 is associated to the first test resource 103-1, a second matching circuit 105b-2 is associated to the second test resource 103-2, a third matching circuit 105b-3 is associated to the third test resource 103-3, and a fourth matching circuit 105b-4 is associated to the fourth test resource 103-4. In other words, the matching circuits 105b-1 to 105b-4 may process the matching instructions in the test sequence 107 in parallel and may, if the associated test resource 103-1 to 103-4 is defined in the matching instructions as being part of the group which is to operate in accordance with the processing instructions 108, forward the processing instructions 108 to its associated test resource 103-1 to 103-4.

Each matching circuit 105b-1 to 105b-4 may be located at its associated test resource 103-1 to 103-4. According to further embodiments, the matching circuit 105b-1 to 105b-4 may even be a part of its associated test resource 103-1 to 103-4.

Figure 1C:
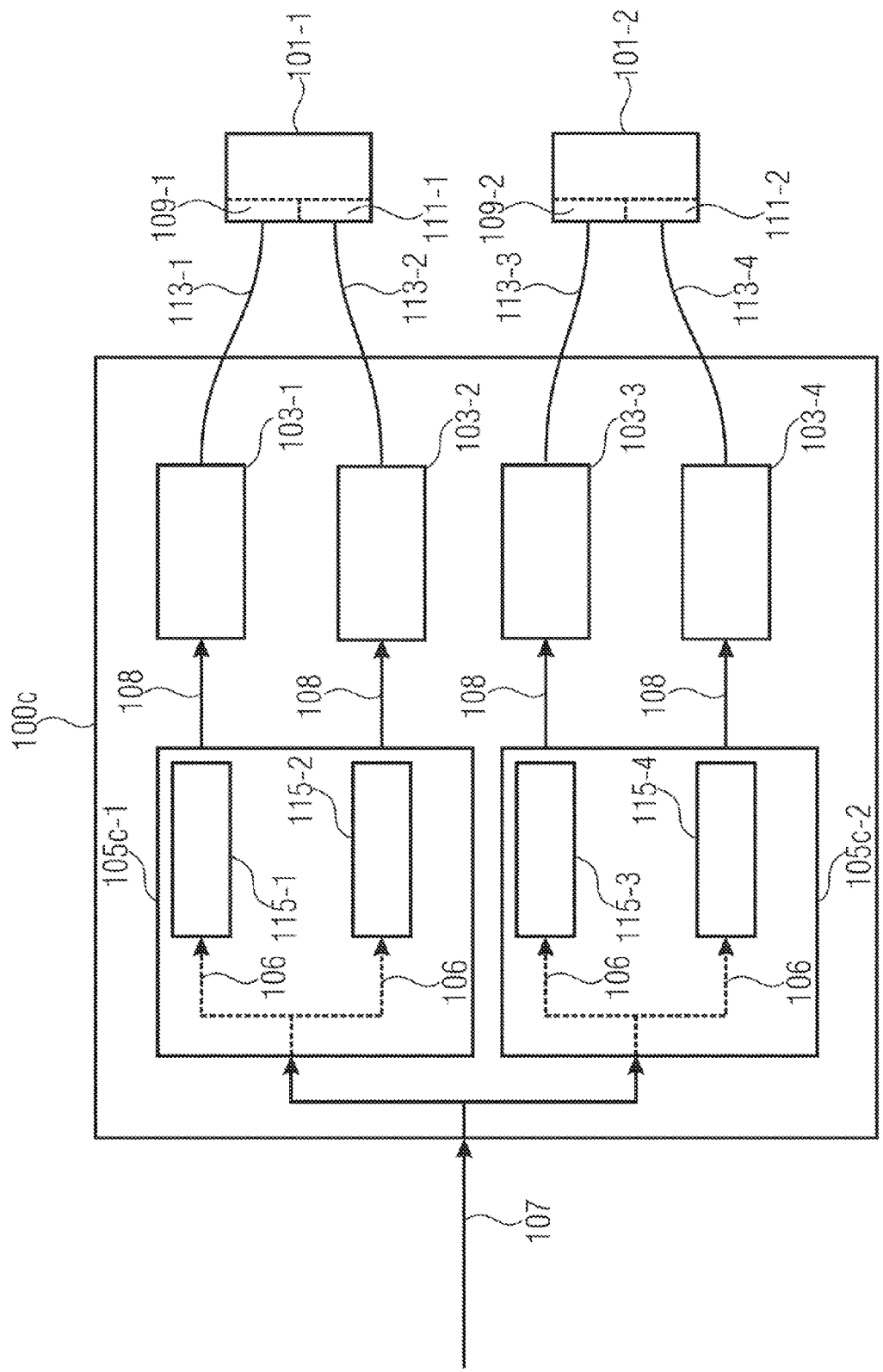
FIG. 1*c* shows a block diagram of a test card for testing one or more devices under test according to another embodiment.

FIG. 1c shows a block diagram of a test card 100c according to another embodiment.

The test card 100c differs from the test card 100a in that it comprises a plurality of matching circuits 105c-1 to 105c-2. Each matching circuit out of the plurality of matching circuits 105c-1 to 105c-2 is associated to a subplurality of test resources out of the plurality of test resources 103-1 to 103-4 of the test card 100c. Functionalities of the matching circuits 105c-1 to 105c-2 may be similar to the functionality of the matching circuit 105a with the difference that each matching circuit 105c-1 to 105c-2 is associated to a subplurality of test resources out of the plurality of the test resources 103-1 to 103-4. Each matching circuit 105c-1 to 105c-2 may comprise memory banks 115-1 to 115-4 which are associated to those of the test resources 103-1 to 103-4 which are connected and associated to the matching circuit 105c-1 to 105c-2.

In the example shown in FIG. 1c, a first matching circuit 105c-1 is associated to a first subplurality of test resources comprising the test resources 103-1 and 103-2, and a second matching circuit 105c-2 is associated to a second subplurality of test resources comprising the test resources 103-3 and 103-4.

According to an embodiment, the matching circuit 105c-1 may process the at least two matching instructions 106 sequentially for each test resource 103-1 to 103-2. The matching circuit 105c-1 may therefore also forward the processing instructions 108 sequentially to the test resources 103-1 to 103-2. The same applies to the matching circuit 105c-2 with respect to the test resources 103-3 to 103-4, mutatis mutandis.

According to a further embodiment, the matching circuit 105c-1 may also process the at least two matching instructions 106 sequentially for the test resources 103-1 to 103-2, but may forward the processing instructions 108 to the test resources 103-1 to 103-2 in parallel (at the same time) such that the test resources 103-1 to 103-2 which are to operate in accordance with the processing instructions 108 process the processing instructions 108 simultaneously. The matching circuit 105c-1 may therefore first process the at least two matching instructions 106 for all test resources 103-1 to 103-2 and may afterwards forward the processing instructions 108 simultaneously only to those test resources, which are to operate in accordance with the processing information 108. The same applies to the matching circuit 105c-2 with respect to the test resources 103-3 to 103-4, mutatis mutandis.

According to another embodiment, the matching circuit 105c-1 may also process the at least two matching instructions 106 for each test resource 103-1 to 103-2 in parallel and may forward the processing instructions 108 to the test resources 103-1 to 103-2, which are to operate in accordance with the processing instructions 108, in parallel. The same applies to the matching circuit 105c-2 with respect to the test resources 103-3 to 103-4 mutatis mutandis.

In the embodiments shown in FIGS. 1a, 1b and 1c, the test cards 100a, 100b resp. 100c comprise each four test resources 103-1 to 103-4; this is just shown as an example. The number of test resources and the number of matching circuits in a test card according to an embodiment can be arbitrary.

Figure 2A:
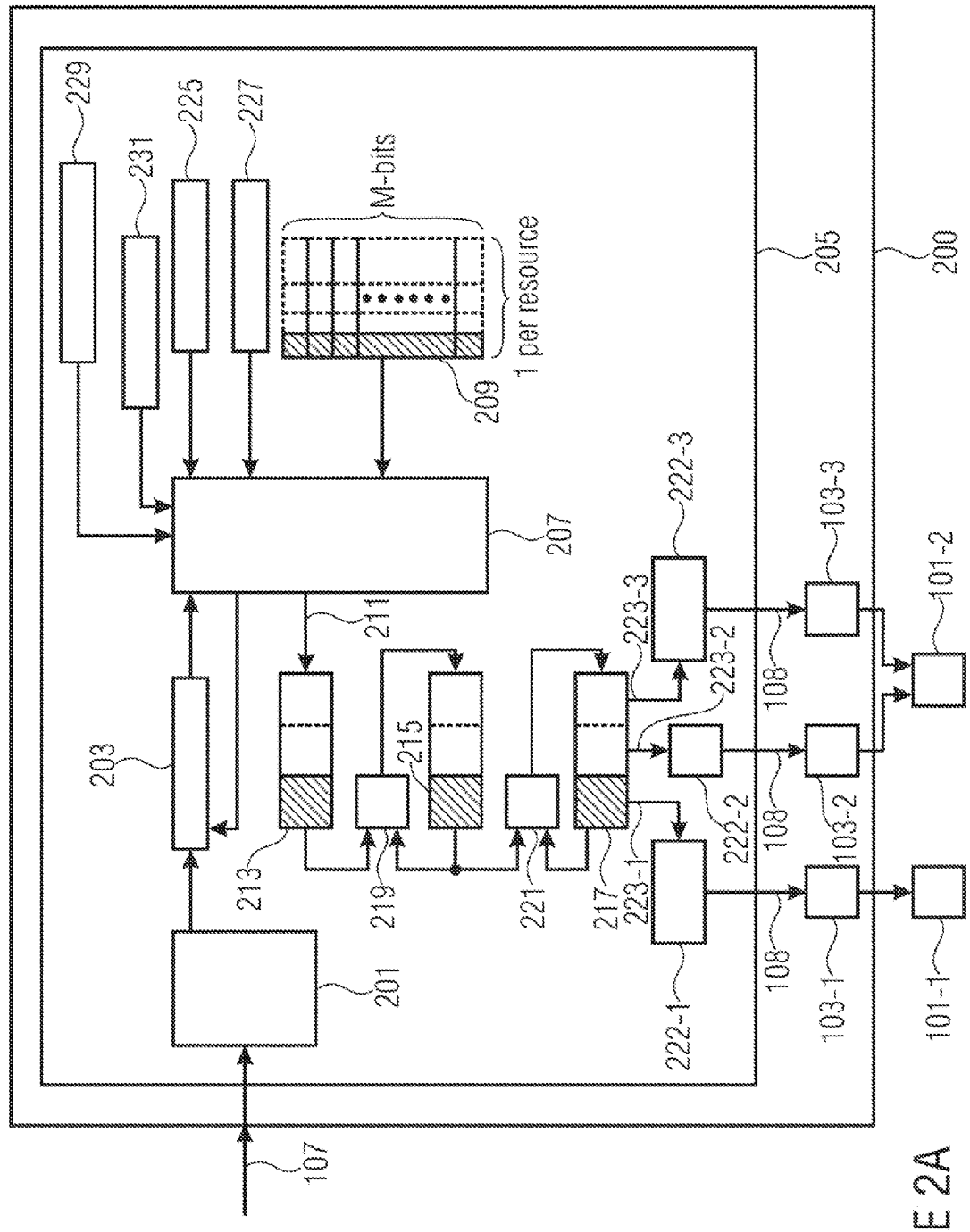
FIG. 2*a* shows a block diagram of a test card for testing one or more devices under test according to another embodiment.

FIG. 2a shows a block diagram of a test card 200 according to another embodiment of the present invention. The functionality of the test card 200 may be similar to the functionality of one of the test cards 100a, 100b and/or 100c. In FIG. 2a, a matching circuit 205 of the test card 200 is shown in more detail than in FIGS. 1a, 1b and 1c. The functionality of the matching circuit 205 may be similar to the functionality of the matching circuit 105a or of the matching circuits 105b-1 to 105b-4 or of the matching circuits 105c-1 to 105c-2. The matching circuit 205 may comprise the additional optional features which are shown in FIG. 2a and will be explained, in the following. It is understood that in further embodiments of the present invention, a matching circuit may only comprise some but not all of the additional features shown in FIG. 2a.

The matching circuit 205 is configured to receive a test sequence 107. The test sequence 107 comprises at least two matching instructions 106 followed by at least one processing instruction 108.

The matching circuit 205 comprises a storage 201 for the incoming test sequence 107. The storage may, for example be a RAM (random access memory) or a FIFO (first in-first out memory). Furthermore, the matching circuit 205 comprises an instruction buffer 203 which is connected to the storage 201. The instruction buffer holds at least one matching instruction which is to be processed by the matching circuit 205. While the matching circuit 205 processes the test sequence 107, individual matching instructions will be transferred from the storage 201 to the instruction buffer 203.

According to an embodiment, the matching circuit 205 may process the test sequence 107 sequentially by transferring a single matching instruction from the storage 201 to the instruction buffer 203 and processing the single matching instruction completely before processing the rest of the test sequence 107.

According to another embodiment the matching circuit may transfer multiple matching instructions at once from the storage 201 to the instruction buffer 203 and process the multiple matching instructions completely before processing the rest of the test sequence 107.

According to another embodiment the instruction buffer 203 may be absent and the matching circuit 205 may process matching instructions by referencing the storage 201 directly.

The matching circuit 205 may comprise (in addition to the subgroup membership memory 209) a physical address register or physical address memory 225, a logical address register or logical address memory 227, a hardware version register or a hardware version memory 229, and a condition register or a condition memory 231. These memories are described in more detail below.

The matching circuit 205 further comprises a control unit 207, Which is connected to the storage 201 and the instruction buffer 203, for processing the matching instructions in the test sequence 107. Furthermore, the matching circuit 205 comprises a subgroup membership memory 209 which is associated to a test resource 103-1 of the test card 200 associated to the matching circuit 205.

The subgroup membership memory 209 may also be designated as resource bitmap. The subgroup membership memory 209 may be programmable.

The resource bitmap or the subgroup membership 209 may comprise multiple locations each containing a single bit. If the matching circuit 205 is configured to process the matching instructions for a plurality of test resources, the matching circuit 205 may comprise a subgroup membership memory 209 for each test resource or one common subgroup membership memory 209, each location of which comprises one bit per test resource associated to the matching circuit 205.

The subgroup membership memory 209 is connected to the control unit 207, such that the control unit 207 can process subgroup membership instructions in the test sequence 107, for example, by using an address or a subgroup defined in a subgroup membership instruction (which is currently held in the instruction buffer 103) to retrieve the value at the corresponding location currently defined in the subgroup membership memory 209. The control unit 211 may, for each matching instruction in the test sequence 107, determine a matching instruction result 211. If the matching circuit 205 is associated to a single test resource 103-1, the matching instruction result 211 comprises a single bit. If the matching circuit 205 is associated to multiple test resources, the matching instruction result 211 comprises one bit per test resource associated to the matching circuit 205.

The matching circuit 205 further comprises a first result memory 213, a second result memory 215 and a third result memory 217. If the matching circuit 205 is associated to a single test resource 103-1, each of the result memories 213, 215 and 217 comprises a single bit. If the matching circuit 205 is associated to multiple test resources, each of the result memories 213, 215 and 217 comprises one bit per test resource associated to the matching circuit 205.

Furthermore, the matching circuit 205 comprises two logic gates 219 and 221. The logic gate 219 computes the bitwise OR of the first result memory 213 and the second result memory 215. The logic gate 221 computes the bitwise AND of the second result memory 215 and the third result memory 217.

The control unit 207 is connected to the first memory 213. The control unit 207 is configured to store the result 211 of the last processed matching instruction in the first memory 213 ("local_match").

The output of the first memory 213 is connected to a first input of the OR gate 219. The output of the second memory 215 is connected to a second input of the OR gate 219. The output of the OR gate 219 is connected to the input of the second memory 215. The control unit 207 is connected to the second memory 215. The control unit 207 is configured to store, if the last processed matching instruction so specifies, the value computed by the OR gate 219 in the second memory 215 ("tmp_match"), The matching circuit 205 may, based on a logical true information stored in the second memory 215, forward the processing instructions 108 to a test resource 103-1 associated to the matching circuit 205. If the matching circuit 205 is associated to multiple test resources, so that the second memory 215 comprises one bit per test resource, the matching circuit 205 may forward the processing instructions 108 to those and only those associated test resources whose corresponding bit of the second memory 215 holds a logical true value.

As shown in FIG. 2a, the matching circuit 205 may further comprise the AND gate 221 and the third memory 217. The output of the second memory 215 is connected to a first input of the AND gate 221. The output of the third memory 217 is connected to a second input of the AND gate 221. The output of the AND gate 221 is connected to the input of the third memory 217. The control unit 207 is connected to the third memory 217. The control unit 207 is configured to store, if the last processed matching instruction so specifies, the value computed by the AND gate 221 in the third memory 217 ("match"). The matching circuit 205 may, based on a logical true information stored in the third memory 217, forward the processing instructions 108 to a test resource 103-1 associated to the matching circuit 205. If the matching circuit 205 is associated to multiple test resources, so that the third memory 217 comprises one bit per test resource, the matching circuit 205 may forward the processing instructions 108 to those and only those associated test resources whose corresponding bit of the third memory 217 holds a logical true value.

For example, matching instructions of the same type may be arranged subsequently in the test sequence 107 and different types of matching instructions may be separated by a "last instruction of this type" instruction. The matching, circuit 205 may be configured to calculate a logical AND, using the AND gate 221, between a logical value (e.g. the third state bit "match") stored in the third memory 217 and the logical value (e.g. the second state bit "tmp_match") stored in the second memory 215, in response to a "last instruction of this type" instruction. The matching circuit 205 may further be configured to store the result of the logical AND calculation into the third memory 217. The matching circuit 205 may be further configured to forward the processing instructions 108 to the test resource 103-1 based on a logical true information stored in the third memory 217. In other words, the matching circuit 205 may be configured to subsequently process all matching instructions in the test sequence 107 and may forward the processing, instructions 108 to the test resource 103-1 if, after processing all matching instructions in the test sequence 107, a true information is stored in the third memory 217.

In other words, the first memory 213 holds the result of the last processed matching instruction, the second memory 215 holds the accumulated result computed by forming a logical OR of the results of a sequence of matching instructions of a current type and the third memory 217 holds the accumulated result computed by forming a logical AND of the results of all currently processed types of matching instructions. Therefore, the first memory 213 and the second memory 215 are updated for each matching instruction. The third memory 217 is updated for each "last instruction of this type" instruction.

Upon detecting a positive match for the test resource 103-1, i.e., when the third memory 217 holds a true value after processing each matching instruction in the test sequence 107, the matching circuit 205 may directly forward the processing instructions 108 to the test resource 103-1 or may generate a selection signal 223-1 for the test resource 103-1 based on which the matching circuit 205 forwards the processing instructions 108 to the test resource 103-1. In other words, based on the state of the third memory 217, the matching circuit 205 may generate the selection signal 223-1 based on which the matching circuit 205 determines if it has to forward the processing information 108 to the test resource 103-1 or not. The matching circuit 205 may, for example, comprise a determiner 222-1, which determines, based on the selection signal 223-1 if it has to forward the processing instructions 108 to the test resource 103-1 and may forward the processing instructions 108 to the test resource 103-1 if the selection signal 223-1 holds a logical true value. If the matching circuit 205 is associated to multiple test resources, the matching circuit 205 may generate one selection signal for each associated test resource and may comprise one determiner for each associated test resource. In FIG. 2a a matching circuit 205 is shown which is associated to three test resources 103-1 to 103-3, which generates three selection signals 223-1 to 223-3 and which comprises three determiners 222-1 to 222-3; this is just shown as an example. The number of test resources associated to one matching circuit 205 according to an embodiment can be arbitrary.

According to an embodiment, the determiner 222-1 may contain a circuit of the type shown in FIG. 10, where the contents of the channel mask register 13 is derived from the selection signal 223-1. For example, the selection signal 223-1 may be assigned to a specific bit of the channel mask register 13, so that the false or true state of the bit represents the false or true state of the selection signal 223-1.

FIG. 3 shows in a flow diagram how the matching circuit 205 from FIG. 2a may work.

In a first step (A) the test sequence 107 arrives in the buffer 201.

In a second step (B) the state bits in the second memory 215 and the third memory 217 are initialized, in all bits of the second memory 215 are set to logical false and all bits of the third memory 217 are set to logical true.

Afterwards (C), each matching instruction is processed by the matching circuit 205. This means while any instructions of the test sequence 107 remain in the buffer 201, the following steps are performed repeatedly for the different matching instructions.

First (D) one matching instruction is transferred from the buffer 201 to the instruction register 203. This instruction in the instruction register 203 is decoded (E) by the control unit 207. Afterwards (F) the value of the matching instruction result 211 is calculated, for example, by comparing the decoded matching instruction with a corresponding memory (for example the subgroup membership memory 209) associated to the test resource 103-1. The matching instruction result 211 is stored in the first memory 213. Afterwards (G), if the decoded matching instruction is of a type that may use it (for example, if the decoded matching instruction tests for subgroup membership), the value of "tmp_match" is computed and stored in the second memory 215. As stated before, the value of "tmp_match" is calculated by performing a logical OR between the output of the first memory 213 and the output of the second memory 215. Afterwards (H), if the decoded matching instruction may use it (for example, if the decoded matching instruction is a "last instruction of this type" instruction), the value of "match" is computed and stored in the third memory 217. As described before, the value of "match" is calculated by performing a logical AND between the output of the second memory 215 and the output of the third memory 217. After storing a new value in the third memory 217, all bits of the second memory 215 are reset to logical false.

In step (G), if no value is computed and stored in the second memory 215, the second memory 215 retains its previous value. In step (H), if no new value is computed and stored in the third memory 217, the second memory 215 is not reset and the third memory 217 retains its previous value.

The steps (D) through (H) may be repeated until every matching instruction inside the test sequence is processed or until the contents of the third memory 217 becomes false for the first time. When the contents of the third memory 217 becomes false, the matching circuit can stop processing the matching instructions and skip processing the remaining matching instructions in this test sequence. If the matching circuit is associated to more than one test resource (i.e., the memories 213, 215 and 217 comprise more than one bit each), the matching circuit continues processing matching instructions as long as at least one bit in the third memory 217 remains true, or until no more matching instructions remain to be processed.

After the matching circuit stops processing matching instructions, (I) each bit of the third memory 217 becomes the selection signal for a single test resource. This selection signal determines if the test resource is to operate in accordance with the processing instructions 108. Finally (J), the matching circuit 205 may pass the processing instructions 108 to the selected test resources (for example, if the matching circuit 205 is associated to more than one test resource, as it has been shown in FIG. 1a) or to a single selected test resource (for example, if the matching circuit 205 is associated to one test resource, as it has been shown in conjunction with FIG. 1b).

As described before the test sequence 107 may comprise matching instructions of different types. According to an embodiment the different types of matching instructions may be chosen out of a group comprising subgroup membership instructions, physical address instructions, logical address instructions, hardware version instructions, condition instructions and/or restart instructions.

The subgroup membership instructions define a subgroup of test resources based on the contents of the subgroup membership memory 209, which are candidates for operating in accordance with the processing instructions 108.

The physical address instructions define a subgroup of test resources based on the contents of the physical address memory 225, which are candidates for operating in accordance with the processing instructions 108.

The logical address instructions define a subgroup of test resources based on the contents of the logical address memory 227, which are candidates for operating in accordance with the processing instructions 108.

The hardware version instructions define a subgroup of test resources based on the contents of the hardware version memory 229, which are candidates for operating in accordance with the processing instructions 108.

The condition instructions define a subgroup of test resources based on the contents of the condition memory 231, which are candidates for operating in accordance with the processing instructions 108.

The restart instructions are a special case of matching instructions which define a restart of the matching process. A test sequence 107 may comprise multiple subsequences, each subsequence comprising a sequence of matching instructions followed by a sequence of processing instructions; the subsequences being separated by single restart instructions. If a match for a first set of matching instructions followed by processing instructions fails, a matching circuit may, in response to a restart instruction, restart the matching process using a subsequent set of matching instructions followed by processing instructions, all these instructions being part of an original test sequence. This may be used, for example, in case test resources with different hardware versions shall perform the same action, but being of different hardware versions need different processing instructions to do so. A first set of matching instructions followed by processing instructions inside the test sequence may therefore define a first group of test resources of a first hardware type to which the processing instructions are adapted and a second set of matching instructions followed by processing instructions may define a second group of test resources of a second hardware type to which the processing instructions of the second set are adapted. The number of subsequences of matching and processing instructions inside a test sequence is unlimited.

To process a restart instruction, the control unit 207 considers the current state of the third memory 217. If a mismatch was detected by the last processed subsequence of matching instructions, the value stored in the third memory 217 will be false. In this case, the matching circuit resumes processing at step (B) of FIG. 3. Otherwise, i.e., when the value stored in the third memory 217 is true, the matching circuit discards the rest of the test sequence, i.e., all subsequent matching, processing and/or restart instructions.

As described before, the subgroup membership memory 209 defines a number of programmable subgroups that the test resource 103-1 can belong to. In other words, the contents of each location of the subgroup membership memory 209 specifies whether the test resource 103-1 is part of a corresponding programmable subgroup; the subgroup membership instructions are used to look up the status of the test resource 103-1 in this local subgroup membership memory 209. If the matching circuit 205 is associated with multiple test resources, each location of the subgroup membership memory 209 specifies, using one bit for each associated test resource, the membership status of all associated test resources in a single programmable subgroup corresponding to this location.

The physical address memory 225 may define a physical address of the test resource 103-1. The value of the physical address memory 225 may be fixed and determined automatically. An address or a value stored in the physical address memory 225 may, for example, determine a physical location of the test resource (e.g., card cage, slot, module and/or channel position on the test card or in general in a test system). According to an embodiment, the contents of the physical address memory 225 may be determined by electrical connections between the test resource and the rest of the test system (for example, by encoded pin connections on a backplane into which individual test cards can be plugged). According to another embodiment, the contents of the physical address memory may be determined by the routing of the test sequence 107 on the way to the test card 200.

Figure 2B:
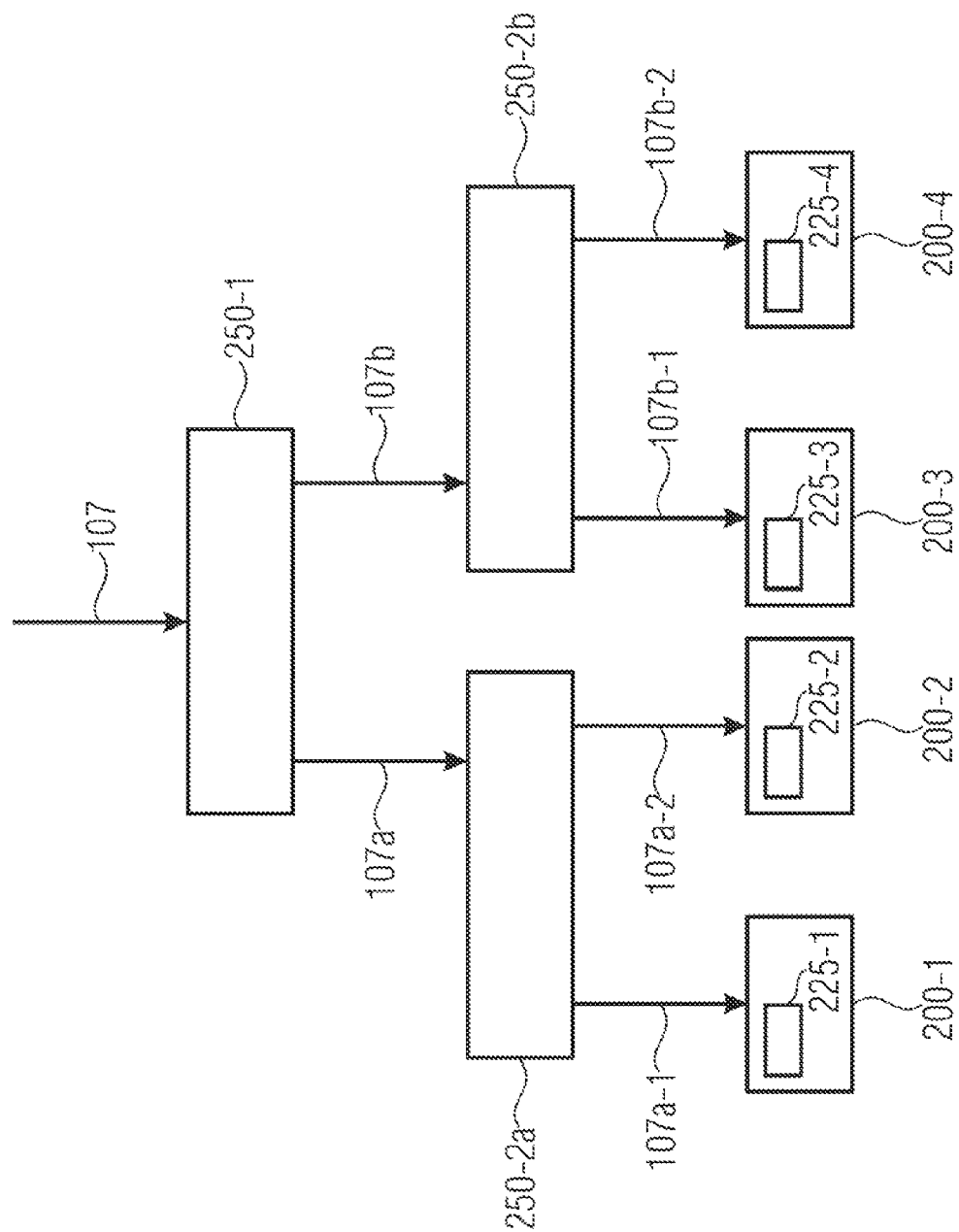
FIG. 2*b* shows a block diagram of a test system comprising multiple test cards (of the type shown in FIG. 2*a*) according to an embodiment.

For example, FIG. 2b shows a test system comprising four test cards 200-1 to 200-4 as well as three routing elements 250-1 and 250-2a to 250-2b. The test sequence 107 is passed to the central routing element 250-1, which outputs two modified test sequences 107a and 107b, where the first modified test sequence 107a contains the information that it was sent to the first routing element 250-2a, and the second modified test sequence 107b contains the information that it was sent to the second routing element 250-2b. Each of the routing elements 250-2a and 250-2b further outputs modified test sequences 107a-1 and 107a-2 (resp. 107b-1 and 107b-2) where each modified test sequence 107a-1, 107a-2, 107b-1 and 107b-2 contains the information that it was sent to a particular test card out of the set of test cards 200-1 to 200-4. The information added by the routing elements 250-1, 250-2a and 250-2b to the modified test sequences 107a-1, 107a-2, 107b-1 and 107b-2 is then used by the test cards 200-1 to 200-4 to determine the contents of the respective physical address memories 225-1 to 225-4. In this way, for example, the contents of the physical address memory 225-1 reflects the fact that the physical location of the test card 200-1 is on a path that includes the first output of the routing element 250-1 and the first output of the routing element 250-2a; corresponding relations hold for the physical address memories 225-2 to 225-4 with respect to the test cards 200-2 to 200-4.

The logical address memory 227 filmy define a logical address of the test resource 103-1. A value or address stored in the logical address memory 227 may be programmable and may be, for example, a logical board or channel ID assigned to the test resource 103-1.

The hardware version memory 229 may define a hardware version or revision of the test resource 103-1, for example, a particular version or revision of the test resource 103-1 (e.g. one particular type of measurement instrument or one particular generation of test cards).

A hardware version instruction may therefore comprise a test if the associated test resource is of a given type.

The condition memory 231 may define a condition or multiple conditions holding true on the test resource 103-1, for example, that the test resource 103-1 is currently applying a stimulus to the device under test, that the test resource 103-1 has detected a failure in the device under test, that the test resource 103-1 is signaling an interruption, or other conditions that the test resource may want to communicate to the controller. According to an embodiment, individual bits of the condition memory may reflect the logical true or false status of corresponding electrical signals output by the test resource 103-1. A condition instruction may therefore comprise a test if the test resource 103-1 is currently signaling a particular condition (or multiple conditions).

The subgroup membership memory 209, the physical address memory 225, the logical address memory 227, the hardware version memory 229 and the condition memory 231 together may create a memory bank associated to the test resource 103-1.

The matching circuit 205 may apply subgroup membership instructions contained in the test sequence 107 to the subgroup membership memory 209, physical address instructions to the physical address memory 225, logical address instructions to the logical address memory 227 hardware version instructions to the hardware version memory 229, and condition instructions to the condition memory 231. The test sequence 107 does not necessarily comprise matching instructions from each type, for example, a test sequence 107 may only comprise subgroup membership instructions and hardware version instructions, but no physical address instructions, no logical address instructions and no condition instructions. The matching circuit 205 combines the results of the individual matching instructions as described above; for example, the matching circuit 205 may forward the processing instructions 108 in the test sequence 107 to the test resource 103-1 if the test resource 103-1 is defined as candidate in at least one of the subgroup membership instructions and in at least one of the hardware version instructions.

According to further embodiments, the matching circuit 205 may only forward the processing instructions 108 to the test resource 103-1 if the test resource 103-1 is defined as candidate for processing the processing instructions 108 in every matching instruction of the test sequence 107.

The table in FIG. 4 shows one possible set of matching instructions that could be supported by a matching circuit 205. Furthermore, the table in FIG. 4 shows which memories are updated by which instruction. From the table in FIG. 4 it can be seen that for each type of matching instructions three different instructions may exist. FIG. 4 also shows that there may be additional variants of matching instructions which compute the matching instruction result 211 in different ways; for example, a "negated" version of the instruction can compute the complement of the result that the corresponding non-negated instruction computes.

In the following, the three different subgroup membership instructions will be explained by way of example; the other instruction types differ from this description only in the way that they compute the matching instruction result 211. All subgroup membership instructions compute the matching result 211 by accessing a location of the subgroup membership memory 209. A first subgroup membership instruction "match_bitmap" sets the matching result 211 to the contents of the subgroup memory at the accessed location and stores the matching result 211 in the first memory 213. It then updates the second memory 215 (via the logical OR gate 219 as described above), but does not update the third memory 217. The test sequence 107 may, for example, comprise a plurality of "match_bitmap" instructions followed by a "match_last_bitmap" instruction, which is a "last instruction of this type" instruction. This means that the "match_last_bitmap" instruction, in addition to the actions performed by the "match_bitmap" instruction, also updates the third memory 217 (via the logical AND gate 221 as described above) and resets the second memory 215 to its default logical false state.

The total effect of a sequence of matching instructions consisting of subsequences of "match_bitmap" instructions each followed by a "match_last_bitmap" instruction thus corresponds to the computation of a logical formula in disjunctive normal form. The result of the computation is left in the third memory 217. When the result is represented as the answer to a subgroup membership query for the test resources associated to the matching circuit 205, it corresponds to a set-theoretic intersection-of-unions operation with sets that corresponds to the subgroups defined by the contents of the subgroup membership memory 209.

Furthermore, the matching circuit 205 may be configured to process a third subgroup membership instruction "match_not_bitmap", which is a "negated" instruction. The intended effect of this instruction is to address all test resources which are not in the subgroup defined by a given location of the subgroup membership memory 209. The "match_not_bitmap" sets the matching result 211 to the logical complement of the contents of the subgroup memory at the accessed location and stores the matching result 211 in the first memory 213. It updates the second memory 215 via the logical OR gate 219 as described above and updates the third memory 217 via the logical AND gate 221 as described above. This instruction allows the matching circuit 205 to perform set-complement computations in addition to unions and intersections.

The matching circuit 205 may be furthermore configured to process a set of physical address instructions, a set of logical address instructions, a set of hardware version instructions, and/or a set of condition instructions as described in the table in FIG. 4. The matching circuit 205 may process each of these instructions in the same way as the corresponding subgroup membership instruction, with the following differences: the physical address instructions compute the matching result 211 by comparing a physical address stored in the instruction buffer 203 (as part of the decoded instruction) with the physical address memory 225; the logical address instructions compute the matching result 211 by comparing a logical address stored in the instruction buffer 203 (as part of the decoded instruction) with the logical address memory 227; the hardware version instructions compute the matching result 211 by comparing a hardware version identifier stored in the instruction buffer 203 (as part of the decoded instruction) with the hardware version memory 229; and the condition instructions compute the matching result 211 by comparing a condition stored in the instruction buffer 203 (as part of the decoded instruction) with the condition memory 231. In all these cases, the comparison may apply to the compared values in their entirety, or to parts (e.g., individual bits or groups of bits) thereof. The result of the comparison may be negated, e.g., for the instructions listed as negated in the table of FIG. 4.

To summarize, each instruction computes a particular value of the matching instruction result 211 as follows:

Match physical location (the physical address instructions): compare a location part of the decoded instruction in the instruction buffer 203 to the physical address memory 225.

Match logical address (the logical address instructions): compare an address part of the decoded instruction in the instruction buffer 203 to the logical address memory 227.

Match bitmap (the subgroup membership instructions): use an address part of the decoded instruction in the instruction buffer 203 to look up the contents of the corresponding location in the subgroup membership memory 209.

Match hardware variant (the hardware version instructions): compare a hardware version part of the decoded instruction in the instruction buffer 203 to the hardware version memory 229.

Match condition (the condition instructions): compare a condition part of the decoded instruction in the instruction buffer 203 to the condition memory 231.

The subset of instructions which compute negated conditions (the third physical address instruction, the third logical address instruction, the third subgroup membership instruction, the third hardware version instruction and the third condition instruction, as listed in the table in FIG. 4) compute the matching result 211 by forming the logical complement of the value that would have been computed by the corresponding non-negated instruction.

All instructions store the matching result 211 in the first memory 213.

All instructions update the second memory 215 based on the first memory 213 and the current value of the second memory 215 by computing the bitwise logical OR of both values.

A subset of instructions (the second and third physical address instructions, the second and third logical address instructions, the second and third subgroup membership instructions, the second and third hardware revision instructions and the second and third condition instructions, as listed in the table in FIG. 4) also update the third memory 217 based on the second memory 215 and the current value of the third memory 217 by computing the bitwise logical AND of both values. These instructions also reset the second memory 215 to a logical false value idler updating the third memory 217.

Figure 5:
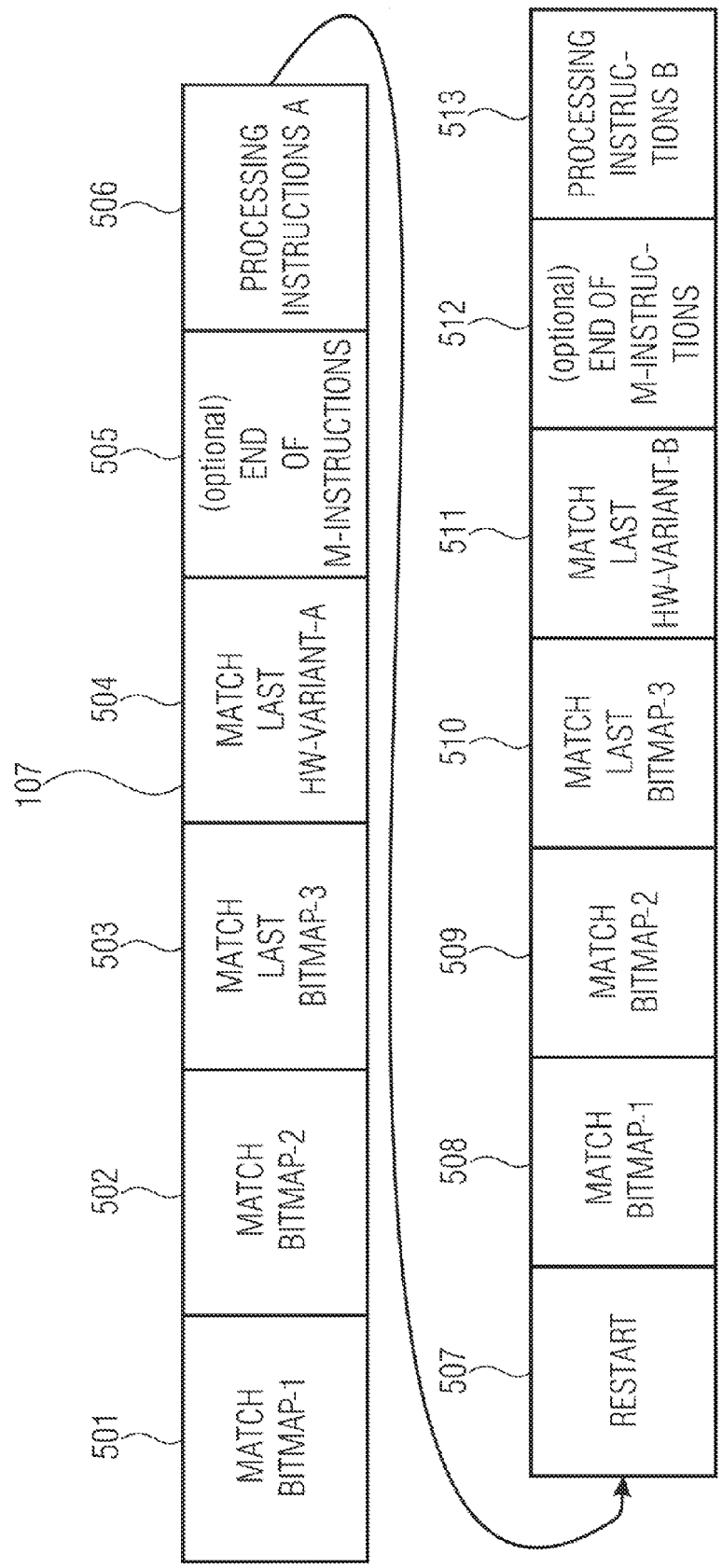
FIG. 5 shows a schematic illustration of an example of a test sequence as it can be received by a matching circuit employed in a test card according to an embodiment.

FIG. 5 shows a schematic illustration of an example of how a test sequence 107 may be received and processed by a matching circuit according to an embodiment. The test sequence 107 comprises a first matching instruction 501 "match bitmap-1" which is a subgroup membership instruction. The first matching instruction 501 defines a first subgroup of test resources which are candidates for operating in accordance with first processing instructions 506 of the test sequence 107. Subsequent to the first matching instruction 501, the test sequence 107 comprises a second matching instruction 502 "match bitmap-2" which is also a subgroup membership instruction. The second matching instruction 502 defines a second subgroup of test resources which are candidates for operating in accordance with the first processing, instructions 506. Subsequent to the second matching instruction 502, the test sequence 107 comprises a third matching instruction 503 "match last bitmap-3" which is a subgroup membership instruction and a "last instruction of this type" instruction. A matching circuit (for example, the matching circuit 205) will perform a logical OR between results of the three matching instructions 501, 502, 503 and will update the third memory 217 after processing the third matching instruction 503. Subsequent to the third matching instruction 503 the test sequence 107 comprises a fourth matching instruction 504 "match last hardware variant-A" which is a hardware version instruction and a "last instruction of this type" instruction. The fourth matching instruction 504 determines a hardware version of test resources which are candidates for operating in accordance with the first processing instructions 506. Because of the fourth matching instruction 504 being a "last instruction of this type" instruction, after processing the fourth matching instruction 504 the matching circuit updates the third memory 217 by performing a logical AND between the result of the fourth matching instruction 504 and the current value of the third memory 217 to determine an updated version of the third memory 217.

Subsequent to the fourth matching instruction 504, the test sequence 107 may comprise an optional "end of matching instructions" instruction 505 which signals the end of the matching instructions. The matching circuit 205 may, in response to the "end of matching instructions" instruction 505, generate the selection signal 223-1 based on the value of the third memory 217, such that the value of the third memory 217 becomes the selection signal 223-1. If the selection signal 223-1 equals a logical true, then the determiner 222-1 forwards the first processing instructions 506, which are contained in the test sequence 107 subsequent to the "end of matching instructions" instructions 505, to the test resource 103-1. If the selection signal 223-1 equals logical false, then the determiner 222-1 discards the processing instructions 506 for the test resource 103-1 or, in other words, the determiner 222-1 does not forward the processing instructions 506 to the test resource 103-1.

Subsequent to the first processing instructions 506, the test sequence 107 comprises a restart instruction 507 in response to which the matching circuit 205 restarts the matching process. In an embodiment the matching circuit 205 may only restart the matching process if the first matching process (using the matching instruction 501-504) failed, otherwise it may discard the rest of the test sequence 107 for the test resource 103-1. Subsequent to the restart instruction 507, the test sequence 107 comprises a fifth matching instruction 508, a sixth matching instruction 509 and a seventh matching instruction 510, which are subgroup membership instructions. The fifth matching instruction 508 may be equal to the first matching instruction 501, the sixth matching instruction 509 may be equal to the second matching instruction 502 and the seventh matching instruction 510 may be equal to the third matching instruction 503, Therefore the matching instructions 508, 509, 510 define the same subgroups of test resources which are candidates for operating in accordance with processing instructions as do the matching instructions 501, 502, 503. Subsequent to the seventh matching instruction 510, the test sequence 107 may comprise an eighth matching instruction 511 "match last hardware variant-B" which is a hardware version instruction and a "last instruction of this type" instruction. The eighth matching instruction 511 differs from the fourth matching instruction 504 in that it defines another hardware version of test resources which are to operate in accordance with second processing instructions 513.

Subsequent to the eighth matching instruction 511, the test sequence 107 may comprise another optional "end of matching instructions" instruction 512, based on which the matching circuit 205 determines the selection signal 223-1 as the final value of the third state bit "match".

The determiner 222-1 forwards, in response to a true value of the selection signal 223-1, the second processing instructions 513 to the test resource 103-1.

The first processing instructions 506 and the second processing instructions 513 may comprise the same operations applied to the device under test 101-1 connected to the test resource 103-1, but may be adapted for the different hardware versions defined in the fourth matching instruction 504 and the eighth matching instruction 511.

The concept shown in FIG. 5 shall be summarized in short in the following:

The test sequence 107 may comprise multiple subsequences, where each subsequence may comprise at least two matching instructions followed by processing instructions. A single "restart" instruction (for example the restart instruction 507) may separate the individual subsequences. The number of subsequences of a single test sequence 107 may be arbitrary. The number of matching instructions in each subsequence may also be arbitrary, and may in particular be different from subsequence to subsequence.

As shown in conjunction with FIG. 1a, matching circuit may be configured to process matching instructions for a plurality of test resources. For example, the matching circuit 205 may be configured to process matching instructions for the test resource 103-1, for a second test resource 103-2 and a third test resource 103-3. In other words, the single matching circuit 205 may be configured to compute the membership of multiple resources (of the test resources 103-1 to 103-3) at once. This is advantageous because of a reduced cost of implementation and furthermore it allows a front-end containing a matching circuit to be added to an existing test system hardware, thus providing backward compatibility.

For handling more than one test resource, the matching circuit 205 may be modified. The matching circuit 205 may, for example, comprise one subgroup membership memory 209 per test resource and may comprise a first memory 213, a second memory 215, and a third memory 217 each comprising multiple bits, with one bit per test resource. For performing the matching in parallel for each test resource 103-1 to 103-3, the matching circuit 205 may comprise an OR gate 219 comprising one single-bit logical OR gate per test resource and an AND gate 221 comprising on single-bit logical AND gate per test resource, For example, in the case where the matching circuit 205 is associated to the three test resources 103-1 to 103-3, the matching circuit 205 may comprise three subgroup membership memories 209, a three-bit first memory 213, a three-bit second memory 215, a three-bit third memory 217, a three-bit logical OR gate 219 and a three-bit logical AND gate 221.

Instead of one subgroup membership memory 209 per test resource, the matching circuit 205 may comprise a single subgroup membership memory 209 where each location comprises multiple bits, with one bit per test resource. For example, in the case where the matching circuit 205 is associated to the three test resources 103-1 to 103-3, each location of the subgroup membership memory 209 may comprise three bits.

Furthermore, the matching circuit 205 may comprise a determiner 222-1 to 222-3 for each test resource 103-1 to 103-3 and may further generate a selection signal 223-1 to 223-3 for each test resource 103-1 to 103-3.

Furthermore, for example, if the matching circuit 205 is configured to handle different types of matching instructions, the matching circuit 205 may comprise a physical address memory 225, a logical address memory 227, a hardware version memory 229 and/or a condition memory 231 for each test resource (not shown in FIG. 2a).

In other words, the matching circuit 205 may be configured to determine for a subplurality of test resources of the plurality of test resources of the test card 200, if they belong to the group of test resources which are to operate in accordance with the processing instructions 108 by processing the matching instructions for each test resource of the subplurality of test resources and to forward the processing instructions 108 to all test resources of the subplurality of test resources which belong to the group of test resources which are to operate in accordance with the processing instructions.

In the example shown in FIG. 2a, the first test resource 103-1 is connected to a first device under test 101-1, the second test resource 103-2 and the third test resource 103-3 are connected to a common second device under test 101-2. Different test resources may therefore be connected to the same device under test or to different devices under test.

In general, modifications, which may be needed to support N test resources in a single matching circuit 205 (where N is the number of test resources to be supported) are:

Either the subgroup membership memory 209 is replicated N times, or each location of the subgroup membership memory 209 is widened to contain N bits.

The physical address memory 225, the logical address memory 227, the hardware version memory 229 and the condition memory 231 are replicated N times. According to further embodiments, it may not be necessary to replicate all these memories; for example, if all N test resources are of the same hardware version, a single hardware version memory 229 is sufficient.

Individual instructions compute a matching result 211 comprising N bits.

The first memory 213, the second memory 215 and the third memory 217 are each widened to contain N bits.

The logical OR gate 219 and the logical AND gate 221 are replicated N times.

When matching is complete, the test resources can be notified of the individual states (for example, using the different selection signals 223-1 to 223-2 or by directly forwarding the processing instructions 108 to the test resources 103-1 to 103-3).

In the following, the concept of the test card shown in FIGS. 1a, 1b, 1c and 2 shall be summarized in short.

A test card according to an embodiment comprises a mechanism (matching circuit) that may be part of each individual resource. The purpose of the matching circuit is to inspect each test sequence that is delivered to the associated resource and to decide if the resource is a member of a group to which the test sequence is addressed. If the outcome of the decision is positive, the resource processes the test sequence, otherwise it discards the test sequence.

Each test sequence comprises information that may be used for determining group membership (a sequence of at least two matching instructions), followed by information to be processed (a sequence of processing instructions) by the members of the group. Both parts (the matching instructions and the processing instructions) can be of arbitrary size (for example, up to the maximum packet size supported by the transport mechanism). A test sequence may comprise multiple subsequences of matching instructions followed by processing instructions, with subsequences separated by special markers (such a restart instructions).

The matching circuit processes the matching instructions sequentially and keeps track of two state bits per test resource (contained in the second memory 215 and the third memory 217) that determine the outcome of the membership test.

The matching circuit also contains a one bit wide (if the matching circuit is associated to one test resource) or an N bit wide (if the matching circuit is associated to N test resources) memory (the subgroup membership memory 209) which is programmable. This is used to represent the configurable groups of which the resource is a member.

For each instruction, the matching circuit computes a local state bit (contained in the first memory 213) based on a set membership test performed by the matching instruction, and updates the tracked state bits in the second memory 215 and the third memory 217 based on the local state bit.

Instructions are provided for performing the following said membership tests:

Physical location of the resource in the tester (physical address instructions), logical identifier match (logical address instructions), test if one or more bits in the bitmap are set (subgroup membership instructions), test if the associated resource is of a given type (hardware version instructions), test if a condition or multiple conditions hold true on the associated test resource (condition instructions).

Instructions are provided for performing complementary versions of the said membership tests (negated instructions).

Instructions may update the second memory 215 only, or they may update both the second memory 215 and the third memory 217.

The final result of the group membership test is the value of the third memory 217 after processing the last matching instruction. If the third memory 217 contains a true value, the resource belongs to the group of test resources which are to operate in accordance with the processing instructions.

Figure 6:
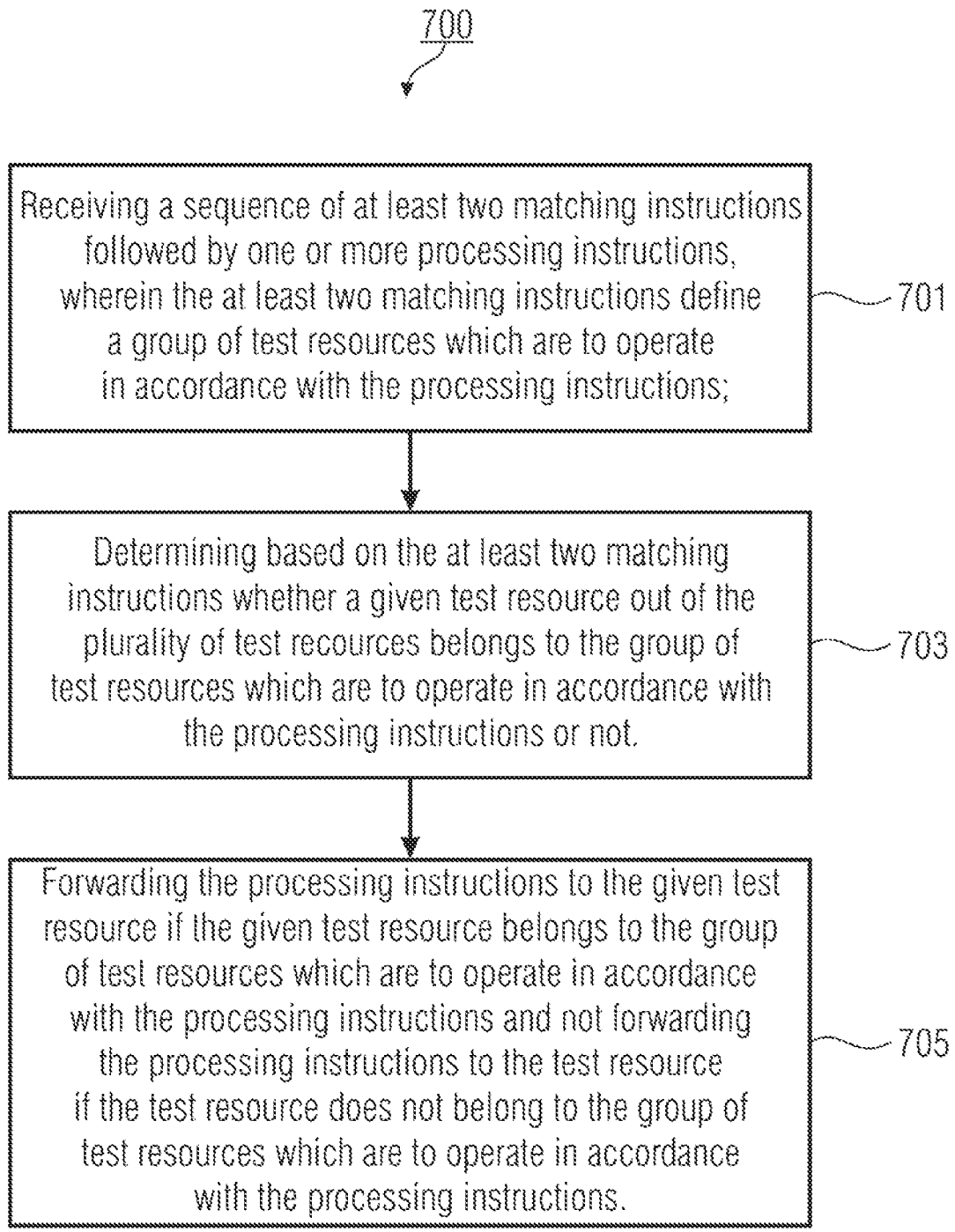
FIG. 6 shows a flow diagram of a method according to an embodiment.

FIG. 6 shows a flow diagram of a method 700 for communicating with one or more devices under test (for example for testing the one or more devices under test) using a plurality of test resources. The method 700 comprises a step 701 of receiving a test sequence of at least two matching instructions followed by one or more processing instruction(s), wherein the matching instructions define a group of test resources which are to operate in accordance with the processing instructions.

Furthermore, the method 700 comprises a step 703 of determining based on the at least two matching instructions whether a test resource belongs to the group of test resources which are to operate in accordance with the processing instructions or not.

Furthermore, the method 700 comprises a step 705 of forwarding the processing instructions to the test resource if the test resource belongs to the group and of not forwarding the processing instructions to the test resource if the test resource does not belong to the group.

The method 700 may, for example, be executed by a test card according to one embodiment (for example, by the test cards 100a, 100b, 100c, 200).

Figure 7:
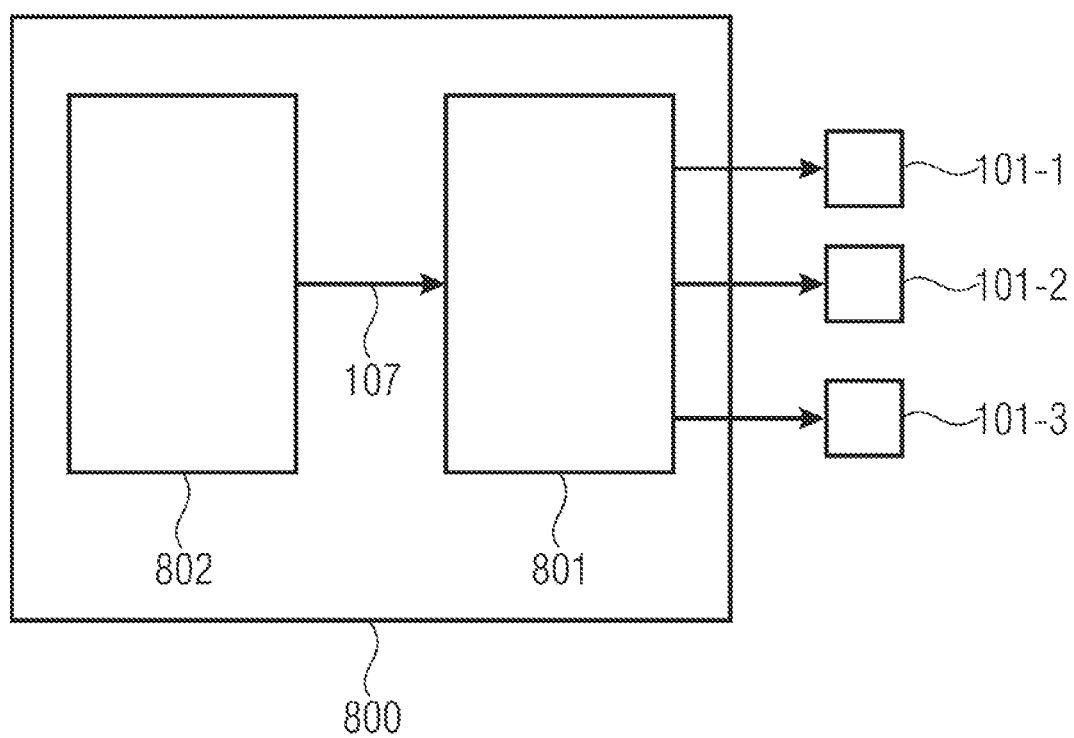
FIG. 7 shows a block diagram of a tester for testing one or more devices under test according to an embodiment.

FIG. 7 shows a block diagram of a tester 800 for testing one or more devices under test 101-1 to 101-3. The tester 800 comprises a test card 801 for testing the one or more devices under test 101-1 to 101-3. The test card 801 may, for example, be one of the test cards 100a, 100b, 100c, 200 or another test card according to an embodiment.

The tester 800 further comprises a processing unit 802 (or a controller 802) configured to communicate with said test card 801. The processing unit 802 is further configured to provide a test sequence 107 of at least two matching instructions followed by one or more processing instruction(s) to the test card 801. The test card 801 may be configured to communicate with the one or more devices under test 101-1 to 101-3 using a plurality of test resources of the test card 801, which process, based on the at least two matching instructions in the test sequence 107, the processing instructions in the test sequence 107, for example, by applying a stimulus to or performing a measurement at the one or more devices under test 101-1 to 101-3.

Figure 8:
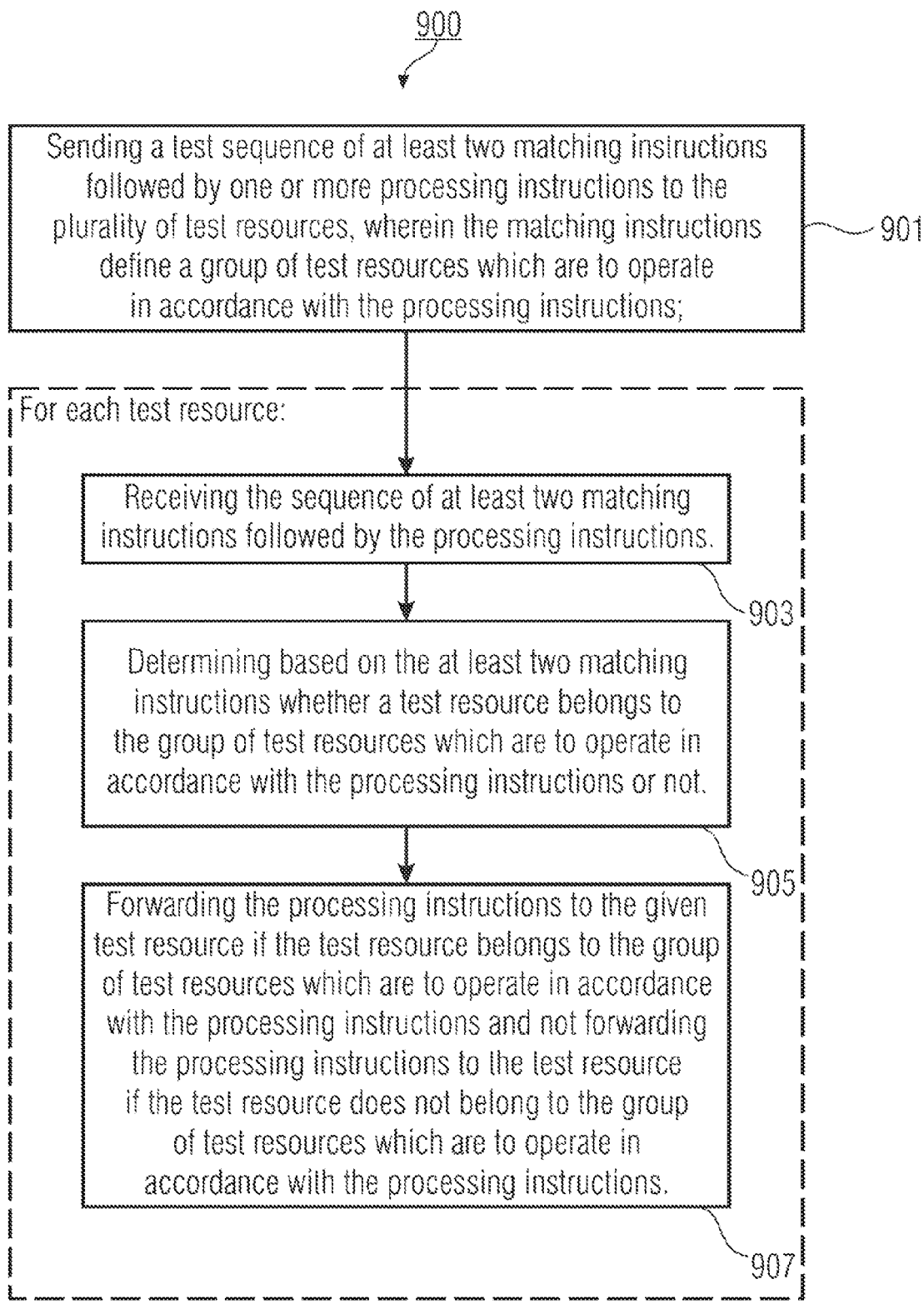
FIG. 8 shows a flow diagram of a method according to an embodiment.

FIG. 8 shows a flow diagram of a method 900 for communicating with one or more devices under test using a plurality of test resources. The method 900 comprises a step 901 of sending a sequence of at least two matching instructions followed by one or more processing instruction(s) to the plurality of test resources, wherein the matching instructions define a group of resources which are to operate in accordance with the processing instructions.

Furthermore, the method 900 comprises a step 903 of receiving the sequence of the at least two matching instructions followed by the processing, instructions.

The method 900 further comprises a step 905 of determining based on the at least two matching instructions whether a test resource belongs to the group of test resources which are to operate in accordance with the processing instructions or not.

The method 900 further comprises a step 907 of forwarding the processing instruction to the test resource if the test resource belongs to the group and of not forwarding the processing instruction to the test resource if the test resource does not belong to the group.

The steps 903, 905, 907 are carried out for each test resource of the plurality of test resources, the steps 903, 905, 907 may be also carried out at each test resource.

In step 901, the test sequence may, for example, be sent as a broadcast message which is broadcast to every test resource.

Figure 9:
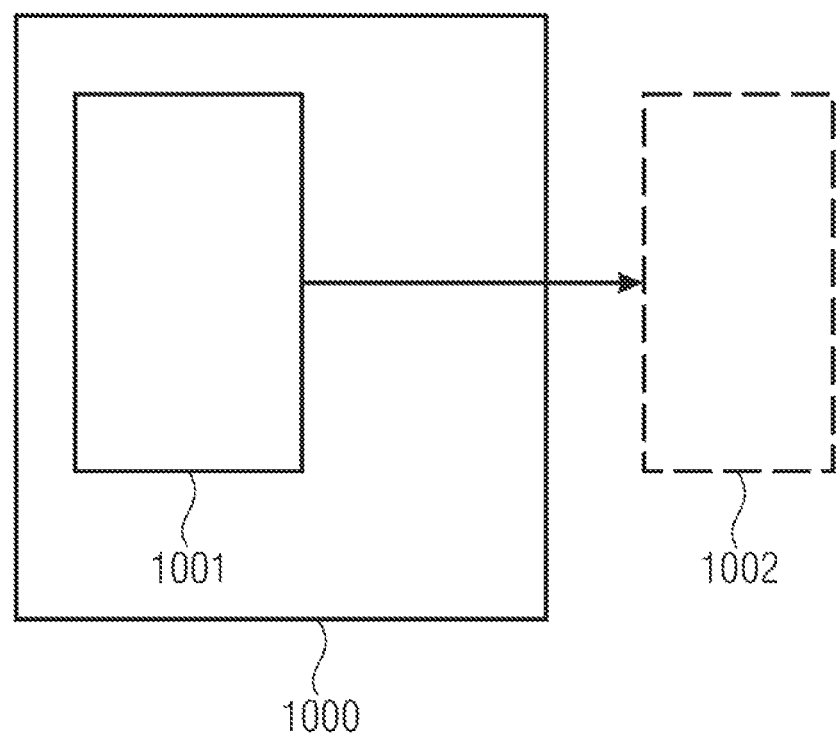
FIG. 9 shows a block diagram of a test system according to an embodiment.

FIG. 9 shows a block diagram of a test system 1000. The test system 1000 comprises a processing unit 1001 (or a controller 1001) configured to communicate with a test card 1002. The test card 1002, for example, may be one of the test cards 101a, 101b, 101c, 200 or may be another test card according to an embodiment. The test card 1002 may be internal or external to the test system 1000.

The processing unit 1001 is configured to provide a test sequence of at least two matching instructions followed by one or more processing instruction(s), wherein the matching instructions define a group of test resources of the test card 1002, which are to operate in accordance with the processing instructions.

Further embodiments of the present invention provide a method for communicating with one or more devices under test. The method comprises a step of providing a sequence of at least two matching instructions followed by one or more processing instruction(s), wherein the matching instructions define a group of test resources of a test card which are to operate in accordance with the processing instructions, the test resources being configured to communicate with the one or more devices under test.

In the following, some aspects of embodiments of the present invention shall be summarized.

Embodiments provide a concept for forming a large number of groups of test resources out of a plurality of test resources.

Changes in group membership are confined to the test resource that is added to, respectively removed from a group.

Groups can be combined using common set operations (union, intersection, complement), which further reduces the number of groups that need to be set up by directly programming test resources.

Groups based on certain criteria (e.g., physical position of a test resource, hardware version of a test resource, etc.) are predefined and require no tor only a minimal) configuration.

In some embodiments an existing hardware of a conventional test system may be used.

Embodiments can be implemented with relatively low effort and costs.

Embodiments allow software to decide how to apportion the address space of test resources.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A test card for testing one or more devices under test, the test card comprising:
   a plurality of test resources, configured to communicate with the one or more devices under test; and
   a matching circuit configured to receive a test sequence of at least two matching instructions followed by one or more processing instructions;
   wherein the at least two matching instructions define a group of test resources which are to operate in accordance with the processing instructions,
   wherein the matching circuit is configured to determine based on the at least two matching instructions whether a given test resource out of the plurality of test resources belongs to the group of test resources which are to operate in accordance with the processing instructions or not and to forward the processing instructions to the given test resource if the given test resource belongs to the group of test resources which are to operate in accordance with the processing instructions and to not forward the processing instructions to the given test resource if the given test resource does not belong to the group of test resources which are to operate in accordance with the processing instructions; and
   wherein the given test resource is configured to apply a stimulus to, or perform measurement of, the one or more devices under test associated with the given test resource based on the processing instructions.

2. The test card according to claim 1,
   wherein the matching circuit is configured to subsequently process the at least two matching instructions and to combine results of the matching instructions to achieve a combined matching instructions result for the given test resource and to forward the processing instructions to the given test resource based on a true information of the combined matching instructions result.

3. The test card according to claim 1,
   wherein the matching circuit comprises a subgroup membership memory for the given test resource, the subgroup membership memory defining a number of subgroups the given test resource belongs to;
   wherein at least a first matching instruction of the at least two matching instruction is a subgroup membership instruction, defining a subgroup of test resources which are candidates for operating in accordance with the processing instructions; and wherein the matching circuit is configured to apply the subgroup membership instruction to the subgroup membership memory to determine if the given test resource is defined within, the subgroup membership instructions and to forward the processing instructions to the given test resource based on a true information of the subgroup membership instruction.

4. The test card according to claim 3, wherein at least a second matching instruction of the at least two matching instructions is a subgroup membership instruction; and wherein the matching circuit is configured to subsequently process the subgroup membership instructions in the test sequence and to forward the processing instructions to the given test resource based on a true information of at least one of the subgroup membership instructions in the test sequence.

5. The test card according to claim 1, wherein the test sequence comprises a plurality of matching instructions from different types of matching instructions, wherein the different types of matching instructions differ in a memory they are applied to;

wherein the matching circuit is configured to subsequently process the matching instructions in the test sequence by applying each matching instruction to the memory associated with its type; and wherein the matching circuit is configured to forward the processing instructions to the given test resource based on true information of at least one matching instruction of each type of matching instructions in the test sequence.

6. The test card according to claim 5, wherein the different types of matching instructions are chosen out of a matching instruction type group, the matching instructions type group comprising:

subgroup membership instructions, defining a subgroup of test resources, which are candidates for operating in accordance with the processing instructions;

physical address instructions, defining a physical address of test resources, which are candidates for operating in accordance with the processing instructions;

logical address instructions, defining logical address of test resources which are candidates for operating m accordance with the processing instructions; and/or hardware version instructions, defining a hardware Version of test resources, which are candidates for operating in accordance with the processing instructions;

condition instructions, defining conditions which hold true on test resources, which are candidates for operating in accordance with the processing instructions;

wherein the matching circuit is configured to apply the subgroup membership instructions to a subgroup membership memory, defining, a number of subgroups the given test resource belongs to;

wherein the matching circuit is configured to apply the physical address instructions to a physical address memory, defining, a physical address of the given test resource;

wherein the matching circuit is configured to apply the logical address instructions to a logical address memory, defining logical address of the given test resource;

wherein the matching circuit is configured to apply the hardware version instructions to a hardware version memory defining a hardware version of the given test resource;

wherein the matching circuit is configured to apply the condition instructions to a condition memory defining conditions holding true on the given test resource; and wherein the matching circuit is configured to forward the processing instructions to the given test resource if the given test resource is defined as candidate in at least one matching instruction of each type of matching instructions in the test sequence.

7. The test card according to claim 1, wherein the matching circuit comprises a first bit memory and a second bit memory:

wherein the matching circuit is configured to store a result of a last processed matching instruction in the first bit memory; and wherein the matching circuit is configured to calculate a logical OR between a logical value stored in the second bit memory and the result of the last processed matching instruction stored in the first bit memory and to store the result of the logical OR in the second bit memory; and wherein the matching circuit is configured to forward the processing instructions to the given test resource based on a logical true information stored in the second bit memory.

8. The test card according to claim 7, wherein the test sequence comprises matching instructions from different types, wherein matching instructions from the same type are arranged subsequent in the test sequence and wherein different types of matching instructions are separated by a "last instruction of this type" instruction;

wherein the matching circuit further comprises a third bit memory;

wherein the matching circuit is configured to calculate a logical AND between a logical value stored in the third bit memory and the logical, value stored in the second bit memory in response to a "last instruction of this type" instruction and to store the result of the logical AND calculation in the third bit memory; and wherein the matching circuit is configured to forward the processing instructions to the given test resource based on a logical true information stored in the third bit memory.

9. The test card according to claim 1, wherein the matching circuit is configured to determine for a subplurality of test resources of the plurality of test resources if they belong to the group of test resources which are to operate in accordance with the processing instructions, by processing the at least two matching instructions for each test resource of the subplurality of test resources and to forward the processing instructions to all test resources of the subplurality of test resources which belong to the group of test resources which are to operate in accordance with the processing instructions.

10. A method for communicating with one or more devices under test, using a plurality of test resources, the method comprising:

receiving a sequence of at least two matching instructions followed by one or more processing instructions, wherein the at least two matching instructions define a group of test resources which are to operate in accordance with the processing instructions;

determining based on the at least two matching instructions whether a given test resource out of the plurality of test resources belongs to the group of test resources which are to operate in accordance with the processing instructions or not;

forwarding the processing instructions to the given test resource if the given test resource belongs to the group of test resources which are to operate in accordance with the processing instructions and not forwarding the processing instructions to the test resource if the test resource does not belong to the group of test resources which are to operate in accordance with the processing instructions; and applying stimulus to or performing measurement of, the one or more devices under test associated with the given test resource based on the processing instructions.

11. A tester for testing, one or more devices under test, the tester comprising:

a test card for testing one or more devices under test, the test card comprising:
 a plurality of test resources, configured to communicate with the one or more devices under test; and
 a matching circuit configured to receive a test sequence of at least two matching instructions followed by one or more processing instructions;
 wherein the at least two matching instructions define a group of test resources which are to operate in accordance with the processing instructions; and
 wherein the matching, circuit is configured to determine based on the at least two matching instructions whether a given test resource out of the plurality of test resources belongs to the group of test resources which are to operate in accordance with the processing instructions or not and to forward the processing instructions to the given test resource if the given test resource belongs to the group of test resources which are to operate in accordance with the processing instructions and to not forward the processing instructions to the given test resource if the given test resource does not belong to the group of test resources which are to operate in accordance with the processing instructions;
 wherein the given test resource is configured to apply a stimulus to, or perform measurement of, the one or more devices under test associated with the given test resource based on the processing instructions; and a processing unit configured to communicate with the test card, wherein the processing unit is configured to provide the test sequence of the at least two matching instructions followed by the processing instructions to the test card.

12. A method for communicating with one or more devices tinder test using a plurality of test resources, the method comprising:

sending a test sequence of at least two matching instructions followed by one or more processing instructions to the plurality of test resources; wherein the matching instructions define a group of test resources which are to operate in accordance with the processing instructions;

for each test resource of the plurality of test resources:

receiving the sequence of at least two matching instructions followed by the processing instructions;

determining based on the at least two matching instructions whether a test resource belongs to the group of test resources which are to operate in accordance with the processing instructions or not;

forwarding the processing instructions to the given test resource if the test resource belongs to the group of test resources which are to operate in accordance with the processing instructions and not forwarding the processing instructions to the test resource if the test resource does not belong to the group of test resources which are to operate in accordance with the processing instructions; and applying stimulus to, or performing measurement of, the one or more devices under test associated with the given test resource based on the processing instructions.

* * * * *